(12) United States Patent
Jeong et al.

(10) Patent No.: US 11,205,645 B2
(45) Date of Patent: Dec. 21, 2021

(54) SEMICONDUCTOR DEVICE

(71) Applicant: Samsung Electronics Co., Ltd., Suwon-si (KR)

(72) Inventors: Jin Woo Jeong, Hwaseong-si (KR); Kwan Young Chun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 102 days.

(21) Appl. No.: 16/800,070

(22) Filed: Feb. 25, 2020

(65) Prior Publication Data

US 2020/0194419 A1  Jun. 18, 2020

Related U.S. Application Data

(63) Continuation of application No. 15/870,072, filed on Jan. 12, 2018, now Pat. No. 10,573,634.

(30) Foreign Application Priority Data

Jun. 9, 2017 (KR) ........................ 10-2017-0072531

(51) Int. Cl.
*H01L 21/00* (2006.01)
*H01L 27/02* (2006.01)
*H01L 27/092* (2006.01)
*H01L 23/535* (2006.01)
*H01L 23/522* (2006.01)
*H01L 29/78* (2006.01)
(Continued)

(52) U.S. Cl.
CPC ...... *H01L 27/0207* (2013.01); *H01L 23/5226* (2013.01); *H01L 23/535* (2013.01); *H01L 27/092* (2013.01); *H01L 27/1104* (2013.01); *H01L 29/785* (2013.01); *H01L 21/823871* (2013.01); *H01L 29/7827* (2013.01)

(58) Field of Classification Search
CPC . H01L 27/0207; H01L 29/785; H01L 27/1104
See application file for complete search history.

(56) References Cited

U.S. PATENT DOCUMENTS 8,507,979 B1* 8/2013 Huang ................ H01L 29/4966
257/330
8,581,348 B2  11/2013 Rashed et al.
(Continued)

OTHER PUBLICATIONS

First Office Action dated Feb. 25, 2021 from the Indian Patent Office for Corresponding Indian Patent No. 201834018282.
(Continued)

*Primary Examiner* — Laura M Menz
(74) *Attorney, Agent, or Firm* — Muir Patent Law, PLLC

(57) ABSTRACT

A semiconductor device includes a substrate, first, second, third and fourth bottom contacts in the substrate, and first, second, third and fourth active fins on respective ones of the first, second, third and fourth bottom contacts, the second and third fins overlapping in a first direction. First, second and third gate electrodes extend longitudinally in the first direction, the first and second gate electrodes disposed on side surfaces of respective ones of the first and fourth active fins and the third gate electrode disposed on side surfaces of the second and third active fins. A first top contact is on the first and second active fins and a second top contact is on the third and fourth active fins.

20 Claims, 19 Drawing Sheets

(51) Int. Cl.
   *H01L 27/11*    (2006.01)
   *H01L 21/8238*  (2006.01)

(56) References Cited

U.S. PATENT DOCUMENTS

| | | |
|---|---|---|
| 9,159,724 B2 | 10/2015 | Wang et al. |
| 9,224,617 B2 | 12/2015 | Pritchard et al. |
| 9,368,484 B1 | 6/2016 | Chen et al. |
| 9,379,027 B2 | 6/2016 | Kim |
| 9,431,300 B1 | 8/2016 | Zeng et al. |
| 9,431,383 B2* | 8/2016 | Baek .................. H01L 27/0924 |
| 9,472,455 B2* | 10/2016 | Stephens ............ H01L 27/0207 |
| 9,515,077 B1 | 12/2016 | Liaw |
| 9,515,148 B2 | 12/2016 | Li et al. |
| 9,536,827 B1 | 1/2017 | Chen et al. |
| 9,570,434 B2 | 2/2017 | Kang et al. |
| 9,589,899 B2 | 3/2017 | Jun et al. |
| 9,589,955 B2 | 3/2017 | Baek et al. |
| 9,960,272 B1* | 5/2018 | Bao .................... H01L 29/0649 |
| 10,573,634 B2* | 2/2020 | Jeong .................. H01L 27/092 |
| 2001/0053089 A1 | 12/2001 | Noble |
| 2011/0108930 A1* | 5/2011 | Cheng ............... H01L 21/76831 257/412 |
| 2012/0014171 A1* | 1/2012 | Chuang ................. G11C 11/412 365/154 |
| 2013/0249003 A1* | 9/2013 | Oh ..................... H01L 27/0924 257/347 |
| 2013/0341733 A1* | 12/2013 | Erickson ......... H01L 21/823475 257/401 |
| 2015/0243667 A1* | 8/2015 | Liaw .................. H01L 27/1104 257/390 |
| 2015/0243733 A1* | 8/2015 | Yang ................. H01L 29/42392 257/401 |
| 2015/0303270 A1 | 11/2015 | Liaw |
| 2015/0333075 A1 | 11/2015 | Yang et al. |
| 2015/0370949 A1 | 12/2015 | Moroz et al. |
| 2016/0005763 A1 | 1/2016 | Masuoka et al. |
| 2016/0064225 A1* | 3/2016 | Kim ..................... H01L 29/518 438/591 |
| 2016/0086947 A1* | 3/2016 | Park .................... H01L 27/0207 257/369 |
| 2016/0099211 A1* | 4/2016 | Baek .................. H01L 27/0207 257/774 |
| 2016/0204107 A1 | 7/2016 | Shimbo |
| 2016/0307767 A1 | 10/2016 | Lee et al. |
| 2017/0018620 A1 | 1/2017 | Liu et al. |
| 2017/0110454 A1* | 4/2017 | Chang ............. H01L 21/823878 |
| 2018/0122936 A1* | 5/2018 | Cheng ................ H01L 29/41741 |
| 2018/0211959 A1* | 7/2018 | Yu ..................... H01L 29/66636 |
| 2018/0226323 A1* | 8/2018 | Do ..................... H01L 27/0207 |
| 2018/0294331 A1* | 10/2018 | Cho ................... H01L 29/0607 |
| 2018/0358347 A1* | 12/2018 | Jeong ................. H01L 27/0924 |
| 2019/0006345 A1* | 1/2019 | Wang ............... H01L 21/823431 |
| 2020/0194419 A1* | 6/2020 | Jeong .................. H01L 29/785 |
| 2021/0111176 A1* | 4/2021 | Hsueh ............ H01L 21/823481 |

OTHER PUBLICATIONS

Search Report dated Nov. 23, 2018 for Singapore Application No. 10201803186X.

Written Opinion dated Dec. 19, 2018 for Singapore Application No. 10201803186X.

\* cited by examiner

SEMICONDUCTOR DEVICE

This application is a continuation of U.S. application Ser. No. 15/870,072 filed on Jan. 12, 2018, which claims the benefit of Korean Patent Application No. 10-2017-0072531, filed on Jun. 9, 2017, in the Korean Intellectual Property Office, the disclosure of each of which is incorporated herein in its entirety by reference.

BACKGROUND

1. Field

The present inventive concept relates to semiconductor devices.

2. Description of the Related Art

As semiconductor devices are required to be smaller and more highly integrated, area integration is becoming one of the most important factors to consider in the design of semiconductor layout. This is because circuits having the same function can be implemented in different layouts, and the overall performance of a semiconductor device can be improved through an appropriate layout.

Therefore, various methods have been implemented to minimize the area when implementing a cross gate connection circuit required in a cell, such as a multiplexer (MUX) or a flipflop. In particular, research is being conducted on a method of improving the space efficiency of the whole layout according to the arrangement of gate contacts and source/drain contacts.

SUMMARY

Aspects of the inventive concept provide a semiconductor device with improved operating performance, but aspects of the inventive concept are not restricted to the ones set forth herein. These and other aspects of the inventive concept will become more apparent to one of ordinary skill in the art to which the inventive concept pertains by referencing the detailed description of the inventive concept given below.

According to some embodiments of the inventive concept, a semiconductor device includes a substrate, first, second, third and fourth bottom contacts in the substrate, and first, second, third and fourth active fins on respective ones of the first, second, third and fourth bottom contacts, the second and third fins overlapping in a first direction. First, second and third gate electrodes extend longitudinally in the first direction, the first and second gate electrodes disposed on side surfaces of respective ones of the first and fourth active fins and the third gate electrode disposed on side surfaces of the second and third active fins. A first top contact is on the first and second active fins and a second top contact is on the third and fourth active fins.

According to further embodiments, a semiconductor device includes first, second, third, fourth and fifth gate electrodes extending longitudinally in a first direction and spaced apart in a second direction, first and second active fins surrounded by the first gate electrode and spaced apart in the first direction, a third active fin surrounded by the second gate electrode, fourth and fifth active fins surrounded by the third gate electrode and spaced apart in the first direction, a sixth active fin surrounded by the fourth gate electrode, and seventh and eighth active fins surrounded by the fifth gate electrode and spaced apart in the first direction. The device further includes a first top contact connecting the third and fourth active fins and a second top contact connecting the fifth and sixth active fins.

Additional embodiments provide a semiconductor device including first, second, third and fourth active fins on a substrate, a first gate electrode extending longitudinally in a first direction and on side surfaces of the first active fin, a second gate electrode extending longitudinally in the first direction and on side surfaces of the second and third active fins, and a third gate electrode extending longitudinally in the first direction and on side surfaces of the fourth active fin. A first top contact is on the first and second active fins and electrically connects the first and second active fins. A second top contact is on the third and fourth active fins and electrically connects the third and fourth active fins. The first gate electrode and the first active fin are components of a first transistor, the second gate electrode and the second active fin are components of a second transistor, the second gate electrode and the third active fin are components of third transistor, and the third gate electrode and the fourth active fin are components of a fourth transistor. Drain nodes of the first and second transistors are electrically connected by the first top contact, and drain nodes of the third and fourth transistors are electrically connected by the second top contact.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, a semiconductor device according to some embodiments will be described with reference to FIGS. 1 through 7.

Figure 1:
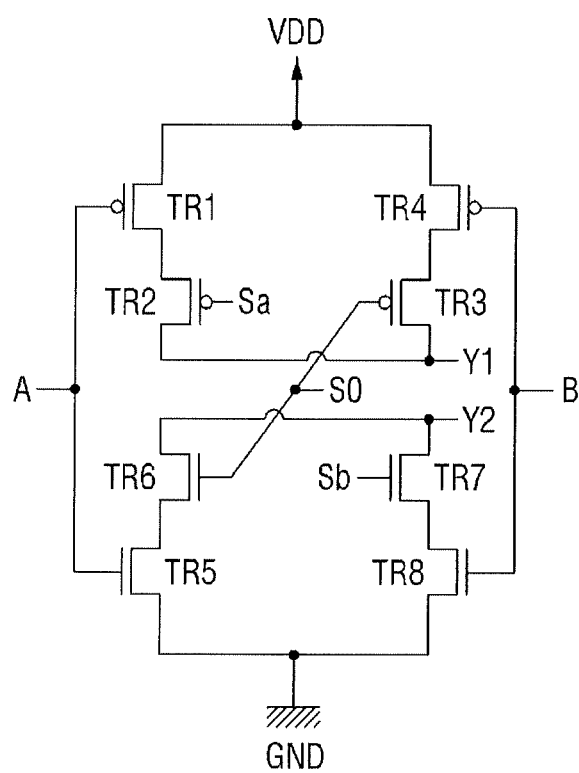
FIG. 1 is a circuit diagram of a gate connection circuit for explaining a semiconductor device according to some embodiments.
Figure 2:
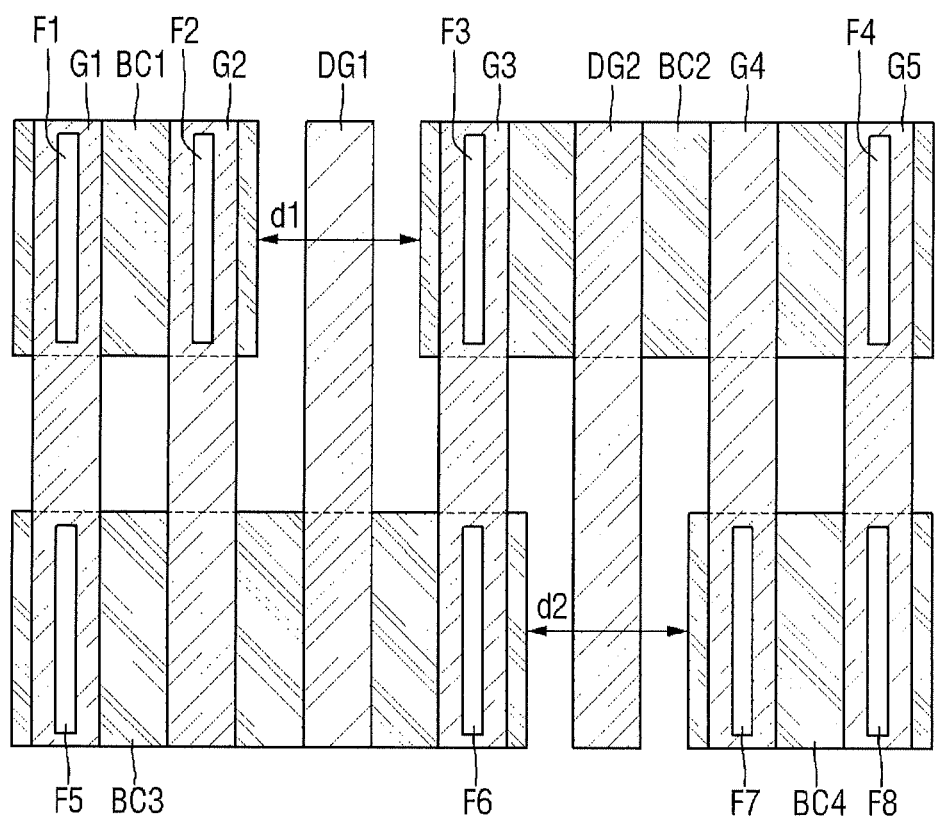
FIG. 2 is a layout diagram of a semiconductor device according to some embodiments.
Figure 3:
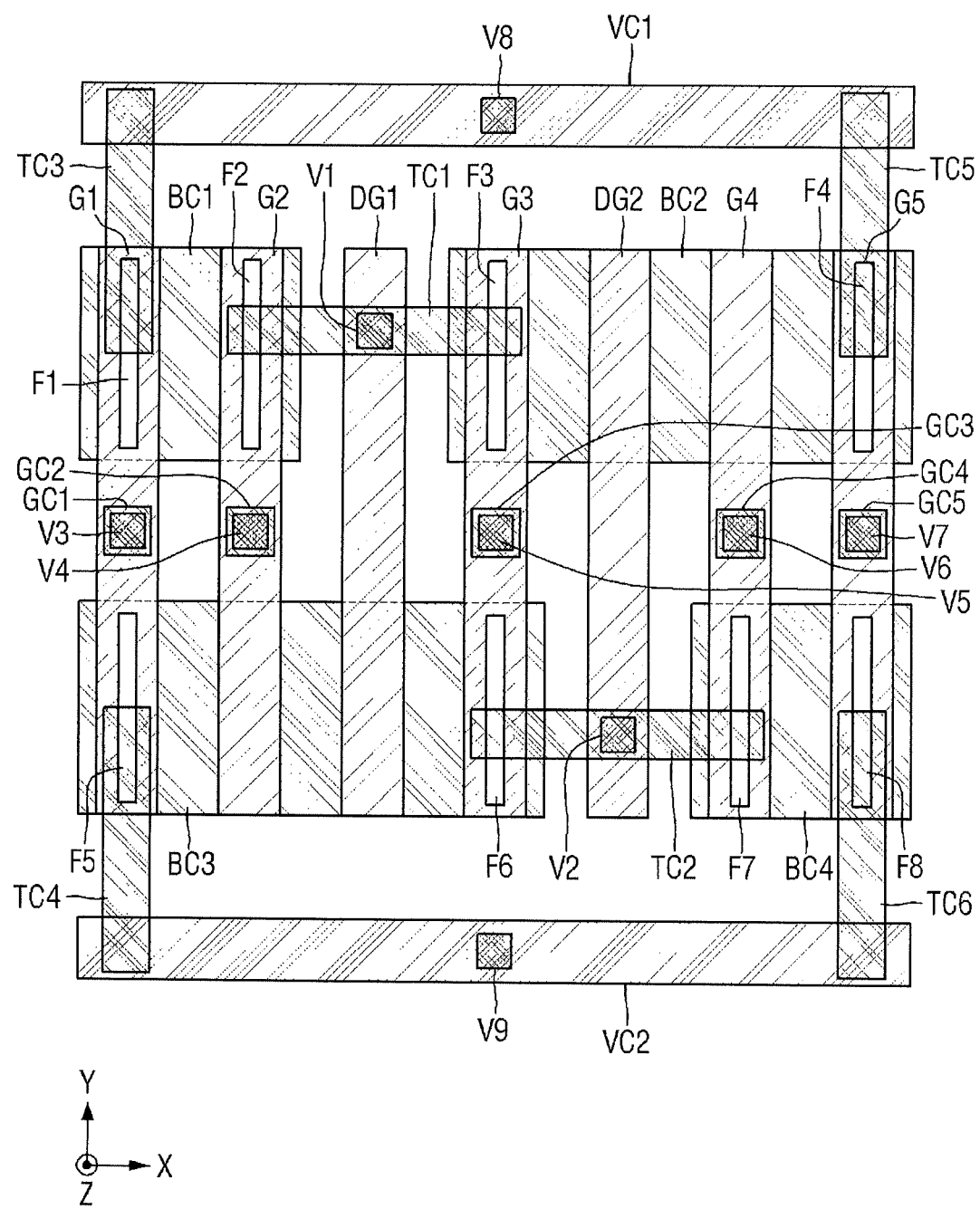
FIG. 3 is a layout diagram illustrating the structure of a level higher than that of the layout diagram of FIG. 2 in detail.
Figure 4:
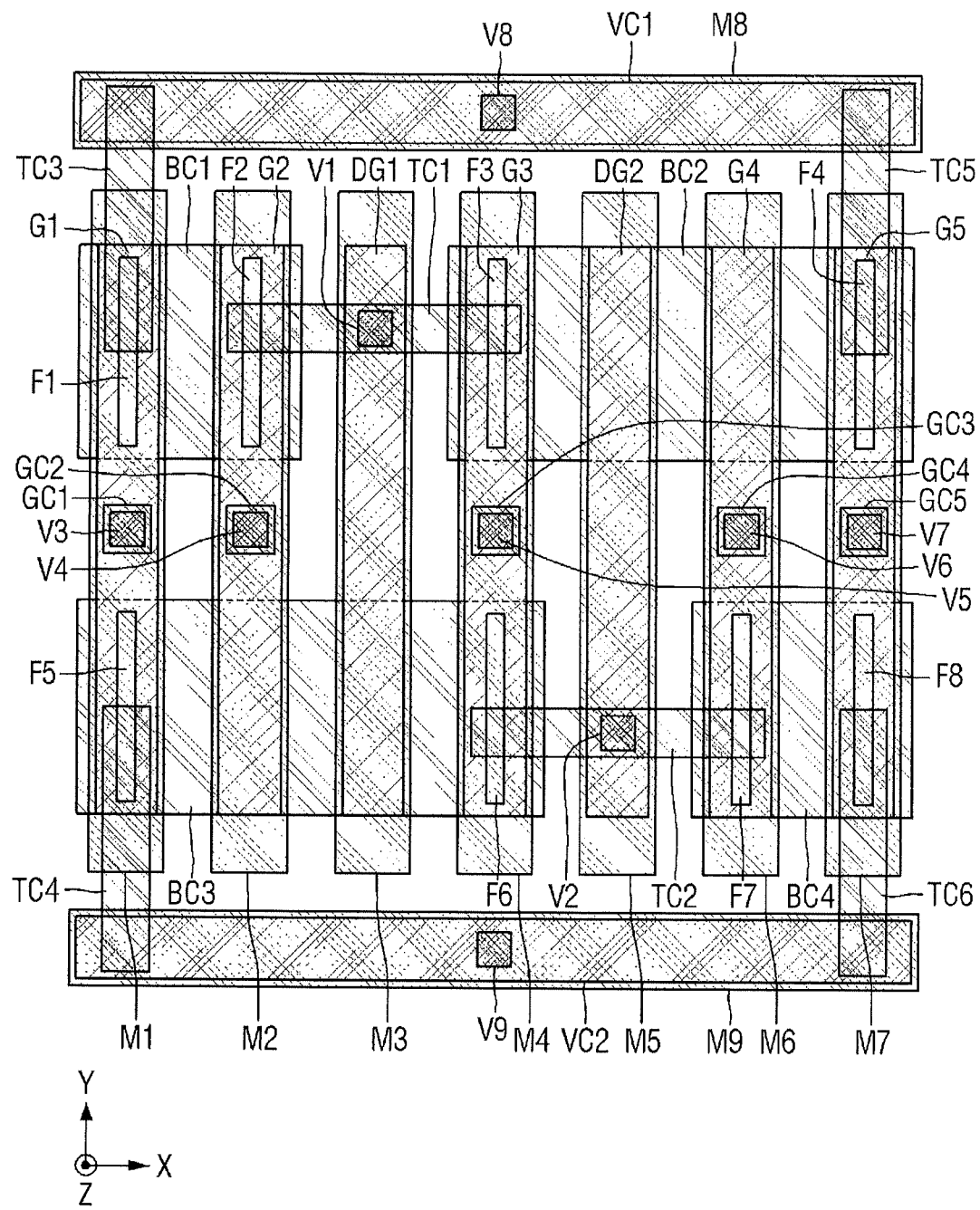
FIG. 4 is a layout diagram illustrating the structure of a level higher than those of the layout diagrams of FIG. 2 and FIG. 3 in detail.
Figure 5:
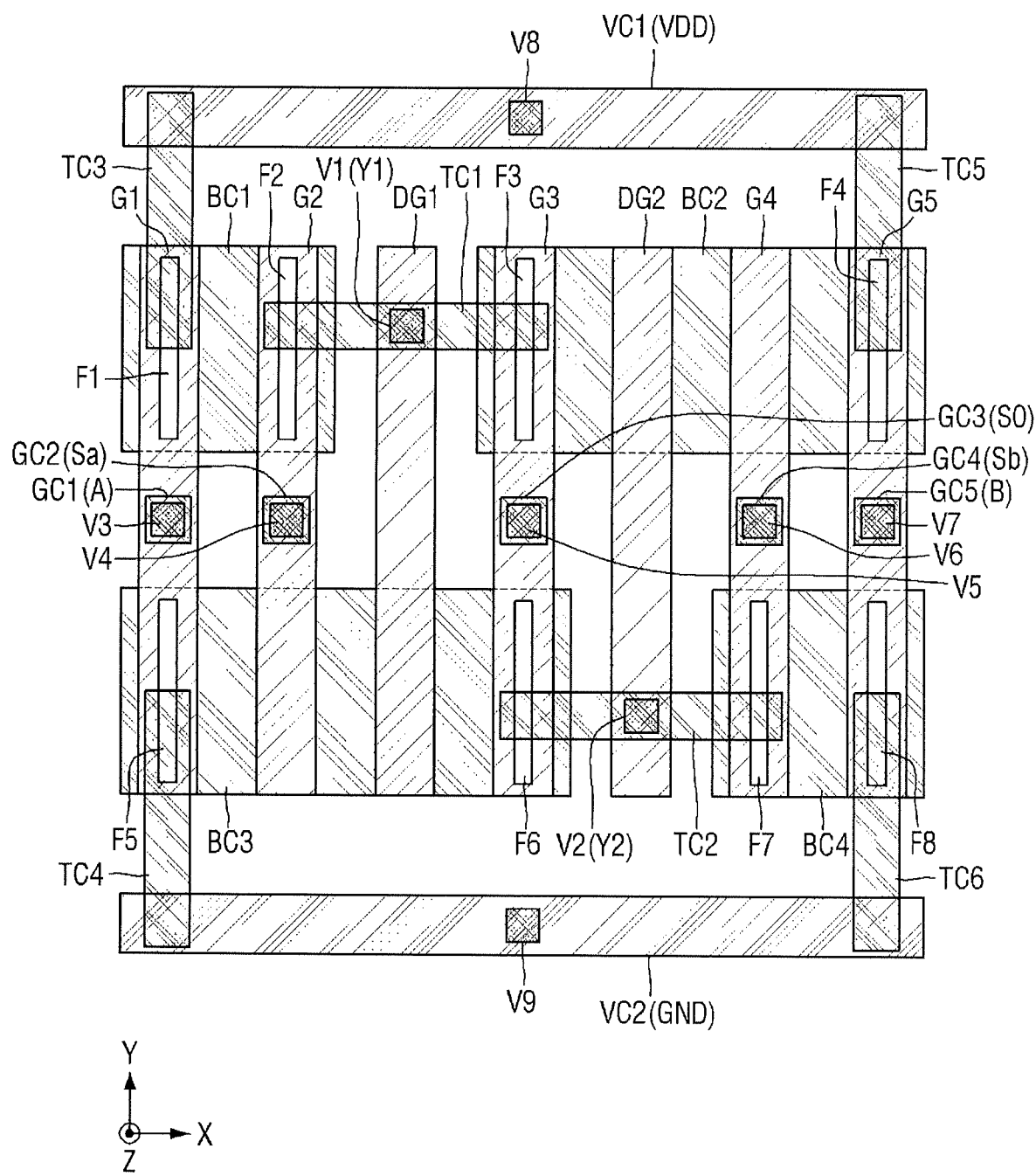
FIG. 5 is a layout diagram obtained by matching FIG. 1 with FIG. 3.
Figure 6:
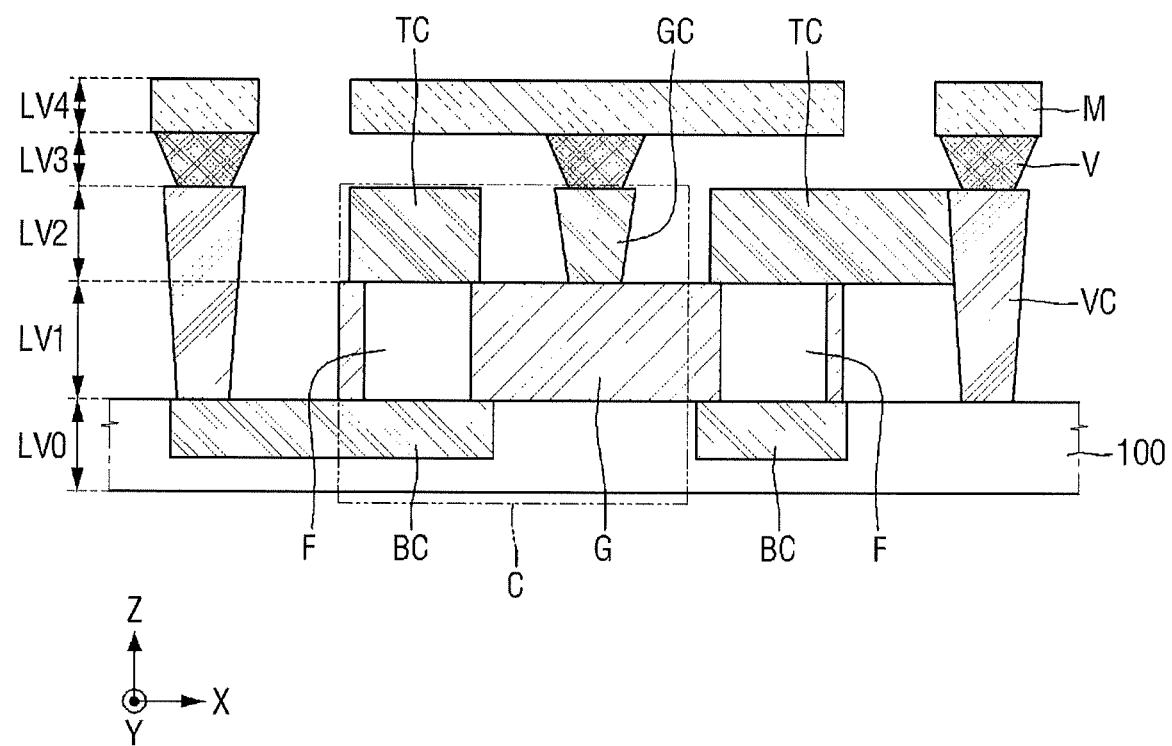
FIG. 6 is a vertical scheme diagram for explaining the vertical structure of FIGS. 2 through 5.
Figure 7:
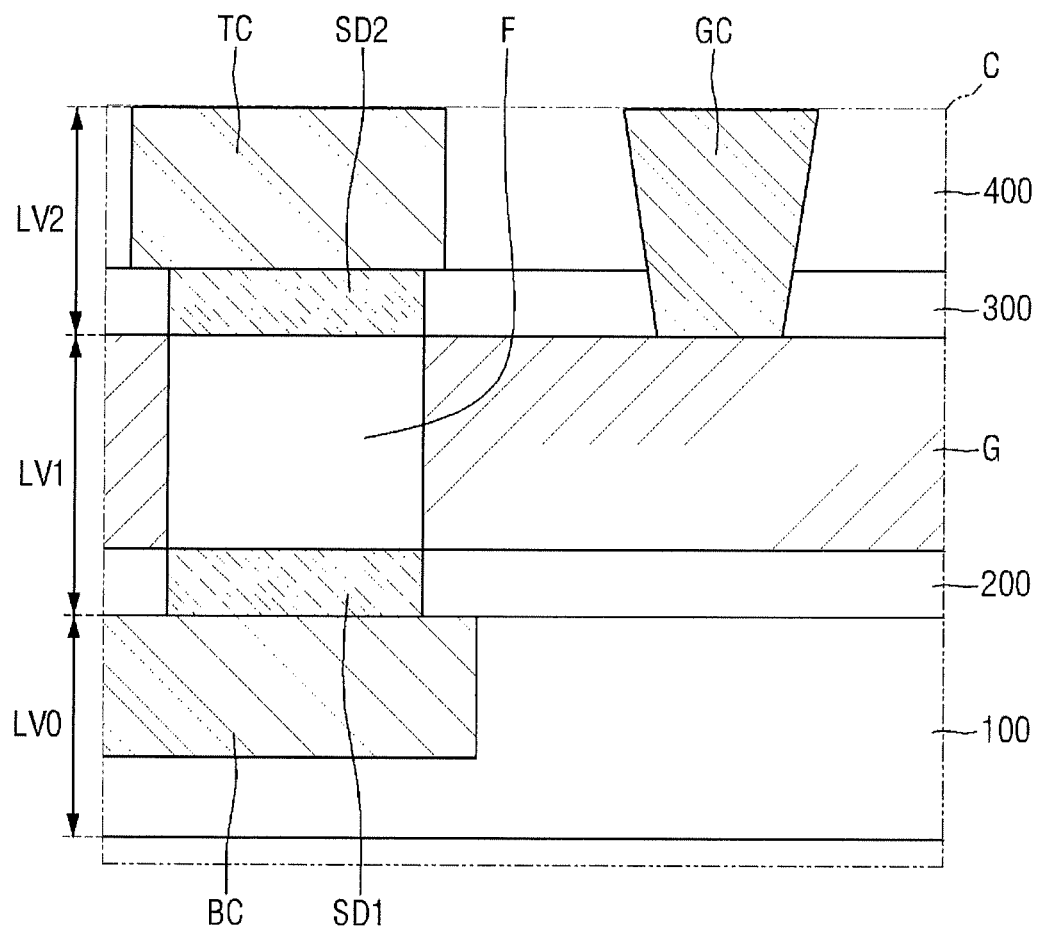
FIG. 7 is an enlarged cross-sectional view of a portion C in FIG. 6.

FIG. 1 is a circuit diagram of a gate connection circuit for explaining a semiconductor device according to some embodiments. FIG. 2 is a layout diagram of a semiconductor device according to some embodiments. FIG. 3 is a layout diagram illustrating the structure of a level higher than that of the layout diagram of FIG. 2 in detail. FIG. 4 is a layout diagram illustrating the structure of a level higher than those of the layout diagrams of FIG. 2 and FIG. 3 in detail. FIG. 5 is a layout diagram obtained by matching FIG. 1 with FIG. 3. FIG. 6 is a vertical scheme diagram for explaining the vertical structure of FIGS. 2 through 5. FIG. 7 is an enlarged cross-sectional view of a portion C in FIG. 6.

Referring to FIG. 1, a semiconductor device according to some embodiments includes first through eighth transistors TR1 through TR8. The first, second, third and fourth transistors TR1 through TR4 may be p-type, i.e., PMOS transistors, and the fifth through eighth transistors TR5 through TR8 may be n-type, i.e., NMOS transistors.

The first transistor TR1 may have a gate node connected to a node A and a source node connected to a node VDD. The node VDD may be a node having a voltage corresponding to a logic high or '1.' A drain node of the first transistor TR1 may be connected to a source node of the second transistor TR2. The second transistor TR2 may have a gate node connected to a node Sa. A drain node of the second transistor TR2 may be connected to a node Y1.

The third transistor TR3 may have a gate node connected to a node SO and a source node connected to a drain node of the fourth transistor TR4. A drain node of the third transistor TR3 may be connected to a node Y2.

The fourth transistor TR4 may have a gate node connected to a node B and a source node connected to the node VDD. The drain node of the fourth transistor TR4 may be connected to the source node of the third transistor TR3.

The fifth transistor TR5 may have a gate node connected to the node A and a source node connected to a node GND. The node GND may be a ground node having a voltage corresponding to a logic low or '0.' A drain node of the fifth transistor TR5 may be connected to a source node of the sixth transistor TR6.

The sixth transistor TR6 may have a gate node connected to the node SO and the source node connected to the drain node of the fifth transistor TR5. A drain node of the sixth transistor TR6 may be connected to the node Y1.

The seventh transistor TR7 may have a gate node connected to a node Sb and a source node connected to a drain node of the eighth transistor TR8. A drain node of the seventh transistor TR7 may be connected to the node Y2.

The eighth transistor TR8 may have a gate node connected to the node B and a source node connected to the node GND. The drain node of the eighth transistor TR8 may be connected to the source node of the seventh transistor TR7.

The gate node of the first transistor TR1 and the gate node of the fifth transistor TR5 may be electrically connected to each other at the node A, and the gate node of the fourth transistor TR4 and the gate node of the eighth transistor TR8 may be electrically connected to each other at the node B.

In addition, the gate node of the third transistor TR3 and the gate node of the sixth transistor TR6 may be electrically connected to each other at the SO node. Accordingly, a gate connection circuit in which gates are connected to each other in an intersecting manner may be formed.

The drain node of the second transistor TR2 and the drain node of the third transistor TR3 may be electrically connected to each other at the node Y1, and the drain node of the sixth transistor TR6 and the drain node of the seventh transistor TR7 may be electrically connected to each other at the node Y2.

If necessary, the node Sa and the node Sb may be connected to each other, and the node Y1 and the node Y2 may be connected to each other.

The layout and vertical structure of a semiconductor device according to some embodiments that realizes the circuit of FIG. 1 will now be described with reference to FIGS. 2 through 7. In the layout and vertical structure of the current embodiments, structures at a plurality of levels overlap. Therefore, the structures for the various levels will be described sequentially for the sake of convenience.

Referring first to FIGS. 2, 6 and 7, a semiconductor device according to some embodiments includes a substrate 100, first, second, third and fourth bottom contacts BC1 through BC4, first through eighth active fins F1 through F8, first through fifth gate electrodes G1 through G5, and first and second dummy gate electrodes DG1 and DG2. The substrate 100 may be, for example, a bulk silicon substrate or a silicon-on-insulator (SOI) substrate. In some embodiments, the substrate 100 may include, for example, silicon germanium, indium antimonide, lead telluride, indium arsenide, indium phosphide, gallium arsenide or gallium antimonide. In some embodiments, the substrate 100 may consist of a base substrate and an epitaxial layer formed on the base substrate.

The substrate 100 may have first, second, third and fourth bottom contacts BC1 through BC4. The first, second, third and fourth bottom contacts BC1 through BC4 may be formed on the substrate 100. Regions where the first, second, third and fourth bottom contacts BC1 through BC4 are formed may be buried in the substrate 100. In particular, since the first, second, third and fourth bottom contacts BC1 through BC4 are buried in part of the substrate 100, an upper surface of the substrate 100 may be higher than lower surfaces of the first, second, third and fourth bottom contacts BC1 through BC4.

The first bottom contact BC1 and the second bottom contact BC2 may be spaced apart from each other in a first direction X. In addition, the first bottom contact BC1 and the second bottom contact BC2 may substantially overlap in the first direction X, within tolerances arising from the fabrication process.

A second direction Y may be a direction intersecting the first direction X. The second direction Y may be, but is not limited to, perpendicular to the first direction X. A third direction Z may be a direction crossing the first direction X and the second direction Y. The third direction Z may be, but is not limited to, a direction crossing the first direction X and the second direction Y. For convenience, the following description assumes that the first direction X, the second direction Y and the third direction Z are orthogonal.

The third bottom contact BC3 and the fourth bottom contact BC4 may be spaced apart from each other in the first direction X. In addition, the third bottom contact BC3 and the fourth bottom contact BC4 may substantially overlap in the first direction X. The first bottom contact BC1 and the second bottom contact BC2 may be spaced apart from each other by a first distance d1 in the first direction X, and the third bottom contact BC3 and the fourth bottom contact BC4 may be spaced apart from each other by a second distance d2 in the first direction X.

The first bottom contact BC1 and the second bottom contact BC2 may be spaced apart from the third bottom contact BC3 and the fourth bottom contact BC4 in the second direction Y. In particular, the first bottom contact BC1 and the second bottom contact BC2 may be located at the same level in the second direction Y, and the third bottom contact BC3 and the fourth bottom contact BC4 may be located at the same level in the second direction Y.

The first bottom contact BC1 and the third bottom contact BC3 may overlap in the second direction Y. Since the third bottom contact BC3 is longer than the first bottom contact BC1 in the first direction X, the whole of the first bottom contact BC1 may overlap the third bottom contact BC3, whereas only part of the third bottom contact BC3 overlaps the first bottom contact BC1.

The second bottom contact BC2 and the fourth bottom contact BC4 may overlap in the second direction Y. Since the second bottom contact BC2 is longer than the fourth bottom contact BC4 in the first direction X, the whole of the fourth bottom contact BC4 may overlap the second bottom contact BC2, whereas only part of the second bottom contact BC2 overlaps the fourth bottom contact BC4.

The second bottom contact BC2 and the third bottom contact BC3 may overlap in the second direction Y. Since the second bottom contact BC2 and the third bottom contact BC3 are not aligned with each other in the first direction X, they may only partially overlap in the second direction Y.

The first through eighth active fins F1 through F8 may be formed on the substrate 100, in particular, on the first, second, third and fourth bottom contacts BC1 through BC4. Specifically, the first active fin F1 and the second active tin F2 may be formed on the first bottom contact BC1, and the third active fin F3 and the fourth active fin F4 may be formed on the second bottom contact BC2. The fifth active fin F5 and the sixth active fin F6 may be formed on the third bottom contact BC3, and the seventh active fin F7 and the eighth active fin F8 may be formed on the fourth bottom contact BC4.

The first, second, third and fourth active fins F1 through F4 may have n-type conductivity, and the fifth through eighth active fins F5 through F8 may have p-type conductivity. This is because the first, second, third and fourth active fins F1 through F4 may be components of PMOS transistors, and the fifth through eighth active fins F5 through F8 components of NMOS transistors. The first through eighth active fins F1 through F8 may extend in the second direction Y, wherein the 'extending' direction of an element refers to a direction in which longer sides of the element extend.

The first, second, third and fourth active fins F1 through F4 may completely overlap in the first direction X. The fifth through eighth active fins F5 through F8 may completely overlap in the first direction X. However, since the first, second, third and fourth active fins F1 through F4 are spaced apart from the fifth through eighth active fins F5 through F8 in the first direction X, they may not overlap in the second direction Y.

The first active fin F1 and the fifth active fin F5 may be aligned with each other in the second direction Y. The third active fin F3 and the sixth active fin F6 may be aligned with each other in the second direction Y. The fourth active fin F4 and the eighth active fin F8 may be aligned with each other in the second direction Y.

First through fifth gate electrodes G1 through G5 may be formed on the substrate 100. The first through fifth gate electrodes G1 through G5 may extend in the second direction Y. The first through fifth gate electrodes G1 through G5 may be spaced apart from each other in the first direction X.

The first through fifth gate electrodes G1 through G5 may cover side surfaces of the first through eighth active fins F1 through F8, respectively. Specifically, the first gate electrode G1 may cover the side surfaces of the first active fin F1 and the fifth active fin F5. The second gate electrode G2 may cover the side surfaces of the second active fin F2.

The third gate electrode G3 may cover the side surfaces of the third active fin F3 and the sixth active fin F6. The fourth gate electrode G4 may cover the side surfaces of the seventh active fin F7. The fifth gate electrode G5 may cover the side surfaces of the fourth active fin F4 and the eighth active fin F8.

The first and second dummy gate electrodes DG1 and DG2 may extend on the substrate 100 in the second direction Y. The first and second dummy gate electrodes DG1 and DG2 may be spaced apart from each other in the first direction X. Specifically, the first dummy gate electrode DG1 may be located between the second gate electrode G2 and the third gate electrode G3 in the first direction X. The second dummy gate electrode DG2 may be located between the third gate electrode G3 and the fourth gate electrode G4 in the first direction X.

Therefore, the first through fifth gate electrodes G1 through G5 and the first and second dummy gate electrodes DG1 and DG2 may be arranged in the order of the first gate electrode G1, the second gate electrode G2, the first dummy gate electrode DG1, the third gate electrode G3, the second dummy gate electrode DG2, the fourth gate electrode G4 and the fifth gate electrode G5 in the first direction X.

The first gate electrode G1 and the second gate electrode G2 may he formed on the first bottom contact BC1, and the third gate electrode G3, the second dummy gate electrode DG2, the fourth gate electrode G4 and the fifth gate electrode G5 may be formed on the second bottom contact BC2.

The first gate electrode G1, the second gate electrode G2, the first dummy gate electrode DG1 and the third gate electrode G3 may be formed on the third bottom contact BC3, and the fourth gate electrode G4 and the fifth gate electrode G5 may be formed on the fourth bottom contact BC4.

The first and second dummy gate electrodes DG1 and DG2 may be disposed in a space between the first bottom contact BC1 and the second bottom contact BC2 and a space between the third bottom contact BC3 and the fourth bottom contact BC4, respectively. One of the reasons why the first and second dummy gate electrodes DG1 and DG2 are provided is to make it easy to separate the first, second, third and fourth bottom contacts BC1 through BC4. In particular, the first and second dummy gate electrodes DG1 and DG2 may be provided to secure a space margin for separating the first, second, third and fourth bottom contacts BC1 through BC4.

FIG. 6 is a vertical scheme diagram for explaining the layout structure of the current embodiments. FIG. 6 is not a cross-sectional view of a specific portion, but is a reference drawing for showing an exemplary vertical relationship in a general case. Therefore, the diagram of FIG. 6 may be different from what a semiconductor device according to some embodiments actually looks and may only show relative and approximate vertical relationships. However, the vertical structure in the layout diagrams of FIGS. 2 through 5 can be understood in more detail with reference to FIG. 6.

In FIG. 6, bottom contacts BC corresponding to the first, second, third and fourth bottom contacts BC1 through BC4 of the current embodiments, a gate electrode G corresponding to the first through fifth gate electrodes G1 through G5, active fins F corresponding to the first through eighth active fins F1 through F8 are illustrated. The first and second dummy gate electrodes DG1 and DG2 may be formed at a height level corresponding to that of the gate electrodes G.

The bottom contacts BC may be buried in a substrate 100, and the gate electrode G and the active fins F may be formed on the bottom contacts BC.

In particular, the bottom contacts BC and the substrate 100 may exist at a buried level LV0 below an upper surface of the substrate 100, and the gate electrode G and the active fins F may be formed at a first level LV1 higher than the buried level LV0.

FIG. 7 is an enlarged cross-sectional view illustrating the actual cross-sectional shape of the portion C in FIG. 6. Since FIG. 7 is an enlarged view of a portion of FIG. 6. it may also be different from what a semiconductor device according to some embodiments actually looks. However, the vertical structure in the layout diagrams of FIGS. 2 through 5 can be understood in more detail with reference to FIG. 7.

Referring to FIG. 7, a first interlayer insulating film 200 may be further interposed between the substrate 100 and a bottom contact BC, the gate electrode G and an active fin F. Therefore, the gate electrode G may actually not contact the substrate 100 and the bottom contact BC. A first source/drain region SD1 may be formed between the active fin F and the bottom contact BC. The first source/drain region SD1 may also not contact the gate electrode G due to the first interlayer insulating film 200.

Referring to FIGS. 3, 6 and 7, a semiconductor device according to some embodiments includes first and second power contacts VC1 and VC2, first through sixth top contacts TC1 through TC6, first through fifth gate contacts GC1 through GC5, and first through ninth vias V1 through V9.

The first and second power contacts VC1 and VC2 may extend on the substrate 100 in the first direction X. The first and second power contacts VC1and VC2 may be spaced apart from each other in the second direction Y. The above-described elements may be disposed between the first and second power contacts VC1 and VC2 in the second direction Y. In particular, the first, second, third and fourth bottom contacts BC1 through BC4, the first through fifth gate electrodes G1 through G5, the first and second dummy gate electrodes DG1 and DG2, and the first through eighth active fins F1 through F8 may be disposed between the first and second power contacts VC1 and VC2 in the second direction Y.

Specifically, the first power contact VC1 may be disposed adjacent to the first, second, third and fourth active fins F1 through F4 in the second direction Y, and the second power contact VC2 may be disposed adjacent to the fifth through eighth active fins F5 through F8 in the second direction Y. The first and second power contacts VC1 and VC2 may be spaced apart from the first through fifth gate electrodes G1 through G5 and the first and second dummy gate electrodes DG1 and DG2 in the second direction Y.

The first through sixth top contacts TC1 through TC6 may be formed on the first through eighth active fins F1 through F8. The first through sixth top contacts TC1 through TC6 may be formed on the first through fifth gate electrodes G1 through G5 and the first and second dummy gate electrodes DG1 and DG2, Specifically, the first top contact TC1 may be formed on second active fin F2, the third active fin F3, the second gate electrode G2, the third gate electrode G3 and the first dummy gate electrode DG1. The first top contact TC1 may extend in the first direction X. The first top contact TC1 may electrically connect the second active fin F2 and the third active fin F3.

The second top contact TC2 may be formed on the sixth active fin F6, the seventh active fin F7, the third gate electrode G3, the fourth gate electrode G4 and the second dummy gate electrode DG2. The second top contact TC2 may extend in the first direction X. The first top contact TC1 may electrically connect the sixth active fin F6 and the seventh active fin F7.

The third top contact TC3 may be formed on the first active fin F1 and the first gate electrode G1. The third top contact TC3 may electrically connect the first active fin F1 and the first power contact VC1.

The fourth top contact TC4 may be formed on the fifth active fin F5 and the first gate electrode G1. The fourth top contact TC4 may electrically connect the fifth active fin F5 and the second power contact VC2.

The fifth top contact TC5 may be formed on the fourth active fin F4 and the fifth gate electrode G5. The fifth top contact TC5 may electrically connect the fourth active fin F4 and the first power contact VC1.

The sixth top contact TC6 may be formed on the eighth active fin F8 and the fifth gate electrode G5. The sixth top contact TC6 may electrically connect the eighth active fin F8 and the second power contact VC2.

In FIG. 6, top contacts TC corresponding to the first through sixth top contacts TC1 through TC6 of the current embodiments and power contacts VC corresponding to the first and second power contacts VC1 and VC2 are illustrated.

The top contacts TC may be formed at a second level LV2 on the active fins F and the gate electrode G, and the power contacts VC may pass through the first level LV1 and the second level LV2. Since the top contacts TC and the power contacts VC can be formed together in a single process, when the top contacts TC and the power contacts VC are in contact with each other, it may mean that their side surfaces are integrally connected to each other. However, the inventive concept is not limited to this case.

The power contacts VC may be formed on the bottom contacts BC to connect the bottom contacts BC to structures (i.e., vias V and wirings M) disposed on the power contacts VC. In some embodiments, the power contacts VC may be connected to the side surfaces of the top contacts TC to connect the top contacts TC to the structures disposed on the power contacts VC. In the current embodiments, the first, second, third and fourth bottom contacts BC1 through BC4 may not contact the first and second power contacts VC1 and VC2, and the first and second power contacts VC1 and VC2 may contact the first through sixth top contacts TC1 through TC6.

Each of the power contacts VC may act as any one of power rail structures in a final structure. In other words, each of the power contacts VC may be finally connected to VDD or GND. This will be described in more detail later.

Referring to FIG. 7, a second interlayer insulating film 300 may be further interposed between the gate electrode G and a top contact TC. Therefore, the gate electrode G may not actually contact the top contact TC. A second source/drain region SD2 may be formed between the active fin F and the top contact TC. The second source/drain region SD2 may also not contact the gate electrode G clue to the second interlayer insulating film 300.

Referring again to FIG. 3, the first through fifth gate contacts GC1 through GC5 may be formed on the first through fifth gate electrodes G1 through G5, respectively. The first through fifth gate contacts GC1 through GC5 may be spaced apart from each other in the first direction X. In addition, the first through fifth gate contacts GC1 through GC5 may be aligned in the first direction X.

The first through fifth gate contacts GC1 through GC5 may be located between the first, second, third and fourth active fins F1 through F4 and the fifth through eighth active fins F5 through F8 in the second direction Y. Specifically, the first gate contact GC1 may be located between the first active fin F1 and the fifth active fin F5. The third gate contact GC3 may be located between the third active fin F3 and the sixth active fin F6. The fifth gate contact GC5 may be located between the fourth active fin F4 and the eighth active fin F8.

The second gate contact GC2 may be located on a side of the second active fin F2, and the fourth gate contact GC4 may be located on a side of the seventh active fin F7. In particular, the second active fin F2 may be located between the first power contact VC1 and the second gate contact GC2 in the second direction Y, and the seventh active fin F7 may be located between the second power contact VC2 and the fourth gate contact GC4 in the second direction Y.

Referring again to FIG. 6, a gate contact GC corresponding to the first through fifth gate contacts GC1 through GCS of the current embodiments is illustrated. Like the top contacts TC and the power contacts VC, the gate contact GC may be disposed at the second level LV2.

Referring again to FIG. 7, a third interlayer insulating film 400 may be formed on the second interlayer insulating film 300, and the gate contact GC may pass through the second interlayer insulating film 300 and the third interlayer insulating film 400 to contact the gate electrode G. Accordingly, a lower surface of the gate contact GC may be lower than a lower surface of the top contact TC formed on the second interlayer insulating film 300. Therefore, the top contact TC may be electrically insulated from the gate electrode G, but the gate contact GC may be electrically connected to the gate electrode G.

Referring again to FIG. 3, the first top contact TC1 may be electrically insulated from the second gate electrode G2, the third gate electrode G3 and the first dummy gate electrode DG1 by the second interlayer insulating film 300, but may be electrically connected to the second active fin F2 and the third active fin F3.

Similarly, the second through sixth top contacts TC2 through TC6 may be electrically insulated from the first through fifth gate electrodes G1 through G5 and the first and second dummy gate electrodes DG1 and DG2.

The first through ninth vias V1 through V9 may be formed on the first and second power contacts VC1 and VC2, the first top contact TC1, the second top contact TC2, and the first through fifth gate contacts GC1 through GCS, respectively. Specifically, the first via V1 may be formed on the first top contact TC1, and the second via V2 may be formed on the second top contact TC2.

The first via V1 may be formed on the first top contact TC1 on the first dummy gate electrode DG1, and the second via V2 may be formed on the second top contact TC2 on the second dummy gate electrode DG2. The first via V1 and the second via V2 may not be aligned with the third through seventh vias V3 through V7 in the first direction X.

The third through seventh vias V3 through V7 may be formed on the first through fifth gate contacts GC1 through GCS, respectively. The third through seventh vias V3 through V7 may be aligned in the first direction X.

The eighth via V8 and the ninth via V9 may be formed on the first power contact VC1 and the second power contact VC2, respectively. The eighth via V8 and the ninth via V9 can be formed anywhere in regions where the first and second power contacts VC1 and VC2 extend. Therefore, the eighth via V8 and the ninth via V9 can be formed at positions other than the positions illustrated in the drawing.

Referring again to FIG. 6, vias V corresponding to the first through ninth vias V1 through V9 of the current embodiments are illustrated. The vias V may be disposed at a third level LV3 on the power contacts VC, the gate contact GC and the top contacts TC.

Next, referring to FIG. 4, a semiconductor device according to some embodiments includes first through ninth wirings M1 through M9.

The first through ninth wirings M1 through M9 may be formed on the first through ninth vias V1 through V9. The first through ninth wirings M1 through M9 may be electrically connected to the first through ninth vias V1 through V9.

The first through seventh wirings M1 through M7 may extend in the second direction Y. The first through seventh wirings M1 through M7 may be spaced apart from each other in the first direction X. The first through seventh wirings may overlap the first through fifth gate electrodes G1 through G5 and the first and second dummy gate electrodes DG1 and DG2 located at a lower level in the third direction Z.

Specifically, the first wiring M1 may overlap the first gate electrode G1 in the third direction Z, and the second wiring M2 may overlap the second gate electrode G2 in the third direction Z. The third wiring M3 may overlap the first dummy gate electrode DG1 in the third direction Z, and the fourth wiring M4 may overlap the third gate electrode G3 in the third direction Z. The fifth wiring M5 may overlap the second dummy gate electrode DG2 in the third direction Z, and the sixth wiring M6 may overlap the fourth gate electrode G4 in the third direction Z. The seventh wiring M7 may overlap the fifth gate electrode G5 in the third direction Z.

In particular, since the third wiring M3 and the fifth wiring M5 are formed at the positions where the first and second dummy gate electrodes DG1 and DG2 are formed, wirings for routing of the nodes Y1 and Y2 can be provided. In this way, wirings can be placed at a fourth level with less waste of space.

In a semiconductor device according to some embodiments, the first through seventh wirings M1 through M7 may not simply extend in the second direction Y but can be bent. In particular, the first through seventh vias V7 can be formed in various shapes as long as they contact the first through seventh vias V1 through V7, respectively.

The eighth wiring M8 may be formed on the first power contact VC1. The eighth wiring M8 may extend in the first direction X. The eighth wiring M8 may be spaced apart from the ninth wiring M9 in the second direction Y. The eighth wiring M8 may be connected to the first power contact VC1 through the eighth via V8.

The ninth wiring M9 may be formed on the second power contact VC2. The ninth wiring M9 may extend in the first direction X. The ninth wiring M9 may be spaced apart from the eighth wiring M8 in the second direction Y. The ninth wiring M9 may be connected to the second power contact VC2 through the ninth via V9.

Referring again to FIG. 6, wirings M corresponding to the first through ninth wirings M1 through M9 of the current embodiments are illustrated. The wirings M may be disposed at a fourth level LV4 on the vias V.

The buried level LV0 and the first, second, third and fourth levels LV1 through LV4 of FIG. 6 are conceptual terms used to define relative vertical positions of elements of the current embodiments. Positions at the same level do not mean substantially the same height. For example, as the positions of the gate contact GC and the top contact TC in FIG. 7 are slightly different, the actual positions of elements located at the same level may also be different.

How the layout diagrams of FIGS. 2 through 5 of a semiconductor device according to some embodiments are matched with the circuit diagram of FIG. 1 will now be described with reference to FIGS. 1 and 5. Referring to FIGS. 1 and 5, the first power contact VC1 may be connected to the node VDD by the eighth wiring M8 of FIG. 4. The second power contact VC2 may be connected to the node GND by the ninth wiring M9 of FIG. 4.

The resistance of a power rail can be reduced by the existence of the eighth wiring M8 and the ninth wiring M9. In particular, even if the eighth wiring M8 and the ninth wiring M9 are not provided, power can be supplied and grounded only by the eighth via V8 and the ninth via V9. However, when the eighth wiring M8 and the ninth wiring M9 are formed together with the first and second power contacts VC1 and VC2, the wiring width may be increased, which, in turn, drastically reduces the consumption of power transmitted.

The first through eighth active fins F1 through F8 may correspond to channel regions of the first through eighth transistors TR1 through TR8, respectively. In particular, the first source/drain region SD1 and the second source/drain region SD2 of FIG. 7 may be vertically formed, and the active fin F connecting the first and second source/drain regions SD1 and SD2 may form a vertical channel. Therefore, each of the first through eighth transistors TR1 through TR8 may be formed as a vertical field-effect transistor (FET) or a vertical nano-sheet. The gate electrode G may cover side surfaces of the active fin F.

A portion connected to the first top contact TC1 through the first via V1 may be the node Y1, and a portion connected to the second top contact TC2 through the second via V2 may be the node Y2. A portion connected to the first gate contact GC1 through the third via V3 may be the node A, and a portion connected to the fifth gate contact GC5 through the seventh via V7 may be the node B.

In addition, a portion connected to the second gate contact GC2 through the fourth via V4 may be the node Sa, and a portion connected to the fourth gate contact GC4 through the sixth via V6 may be the node Sb. A portion connected to the third gate contact GC3 through the fifth via V5 may be the SO node.

A semiconductor device according to some embodiments may provide a layout that realizes a gate connection circuit in a vertical FET or vertical nano-sheet structure. This layout includes two dummy gate electrodes to secure a space margin for forming bottom contacts. The dummy gate electrodes can also secure a space for wirings required for routing. Therefore, since the space margin can be secured at both low and high levels, space can be efficiently utilized. Accordingly, this can increase the degree of integration of the semiconductor device, thereby lowering the production cost and improving the overall performance.

Hereinafter, a semiconductor device according to some embodiments will be described with reference to FIGS. 2, 7 and 8. For simplicity, a description of elements substantially identical to those described above will be given briefly or omitted.

Figure 8:
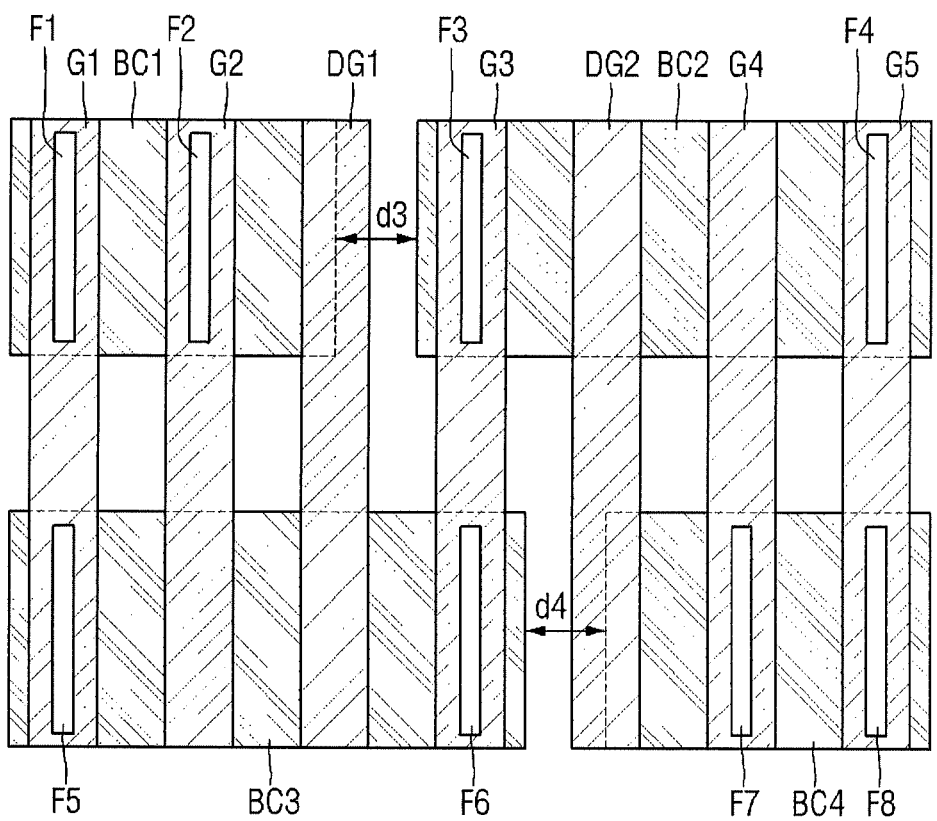
FIG. 8 is a layout diagram of a semiconductor device according to some embodiments.

FIG. 8 is a layout diagram of a semiconductor device according to some embodiments. Referring to FIG. 8, a first dummy gate electrode DG1 of a semiconductor device according to some embodiments may be formed on a first bottom contact BC1. As described above with reference to FIG. 7, since a first interlayer insulating film 200 is formed on a gate electrode G and a bottom contact BC, the bottom contact BC and the gate electrode G may be insulated from each other.

Therefore, the first bottom contact BC1 and a second bottom contact BC2 can be spaced apart in the first direction X by a third distance d3 smaller than the first distance d1 in FIG. 2. In particular, this may be a process gain obtained by the presence of the first dummy gate electrode DG1. In other words, the difficulty of manufacturing a semiconductor device according to some embodiments can be lowered by the first dummy gate electrode DG1.

Likewise, a second dummy gate electrode DG2 may be formed on a fourth bottom contact BC4. Therefore, a distance in the first direction X between a third bottom contact BC3 and the fourth bottom contact BC4 may be a fourth distance d4 smaller than the second distance d2 in FIG. 2.

In particular, even if there is a misalignment problem of a patterning block such as a mask, a space margin corresponding to the first and second dummy gate electrodes DG1 and DG2 can be obtained, the defect rate of the semiconductor device can he lowered, while the reliability of the semiconductor device is increased.

Hereinafter, a semiconductor device according to some embodiments will be described with reference to FIG. 9. For simplicity, a description of elements substantially identical to those described above will be given briefly or omitted.

Figure 9:
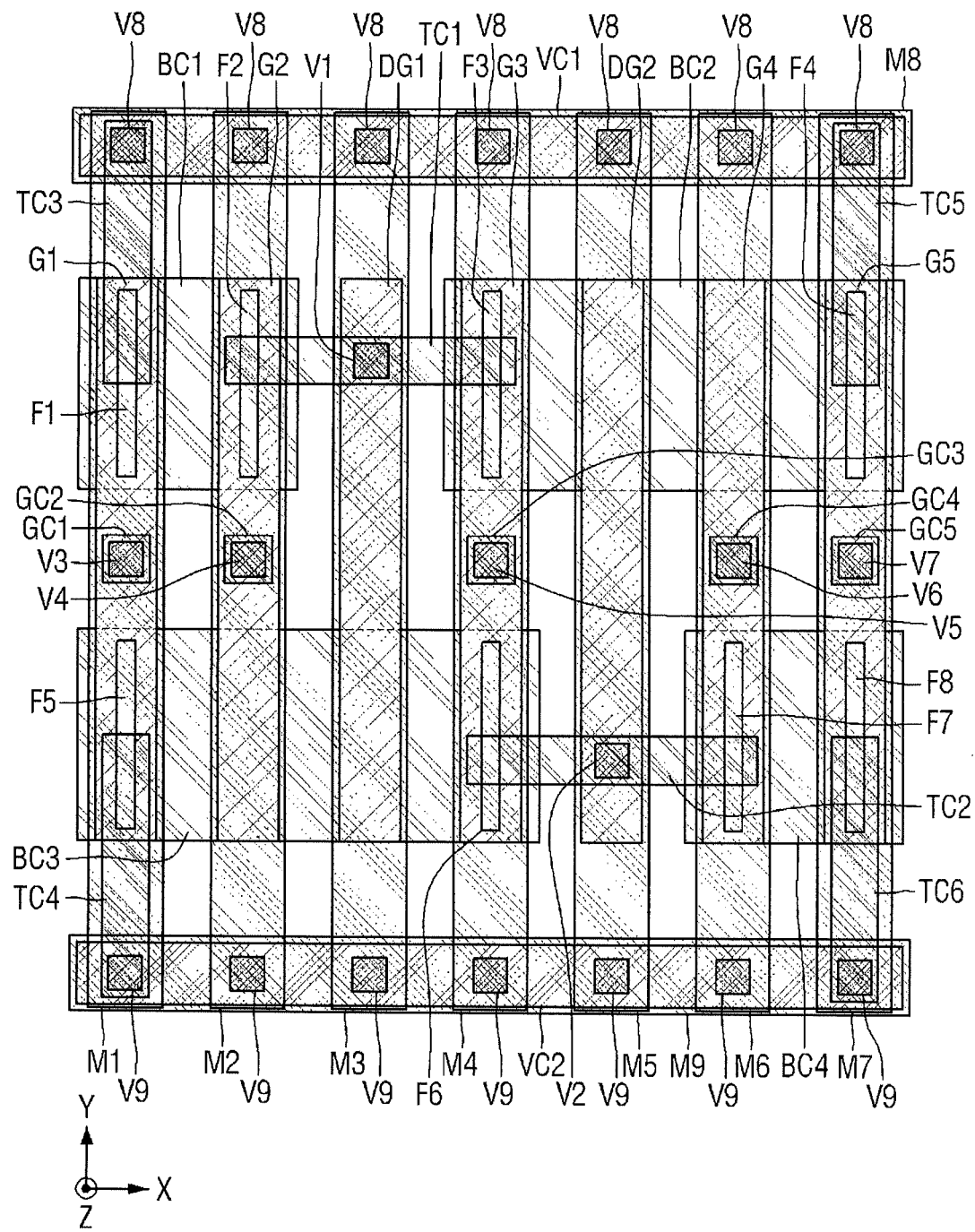
FIG. 9 is a layout diagram of a semiconductor device according to some embodiments.

FIG. 9 is a layout diagram of a semiconductor device according to some embodiments. Referring to FIG. 9, a semiconductor device according to some embodiments may not include the eighth wiring M8 and the ninth wiring M9 of FIG. 4.

In particular, first through seventh wirings M1 through M7 of a semiconductor device according to some embodiments may extend a long distance to overlap first and second power contacts VC1 and VC2 in the third direction Z. Accordingly, a plurality of vias, here shown as including seven eighth vias V8 and seven ninth vias V9, may be provided to connect the first through seventh wirings M1 through M7 to the first and second power contacts VC1 and VC2.

In principle, patterning wirings in two directions is much more difficult than patterning wirings in one direction. Therefore, patterning the first through seventh wirings M1 through M7 only in the second direction Y can reduce process difficulty and reduce mask cost.

In particular, a semiconductor device according to some embodiments can realize the same circuit as the embodiments of FIG. 2 with lower process difficulty and lower manufacturing cost.

Hereinafter, a semiconductor device according to some embodiments will be described with reference to FIGS. 1, 2 through 5, and 10. For simplicity, a description of elements substantially identical to those described above will be given briefly or omitted.

Figure 10:
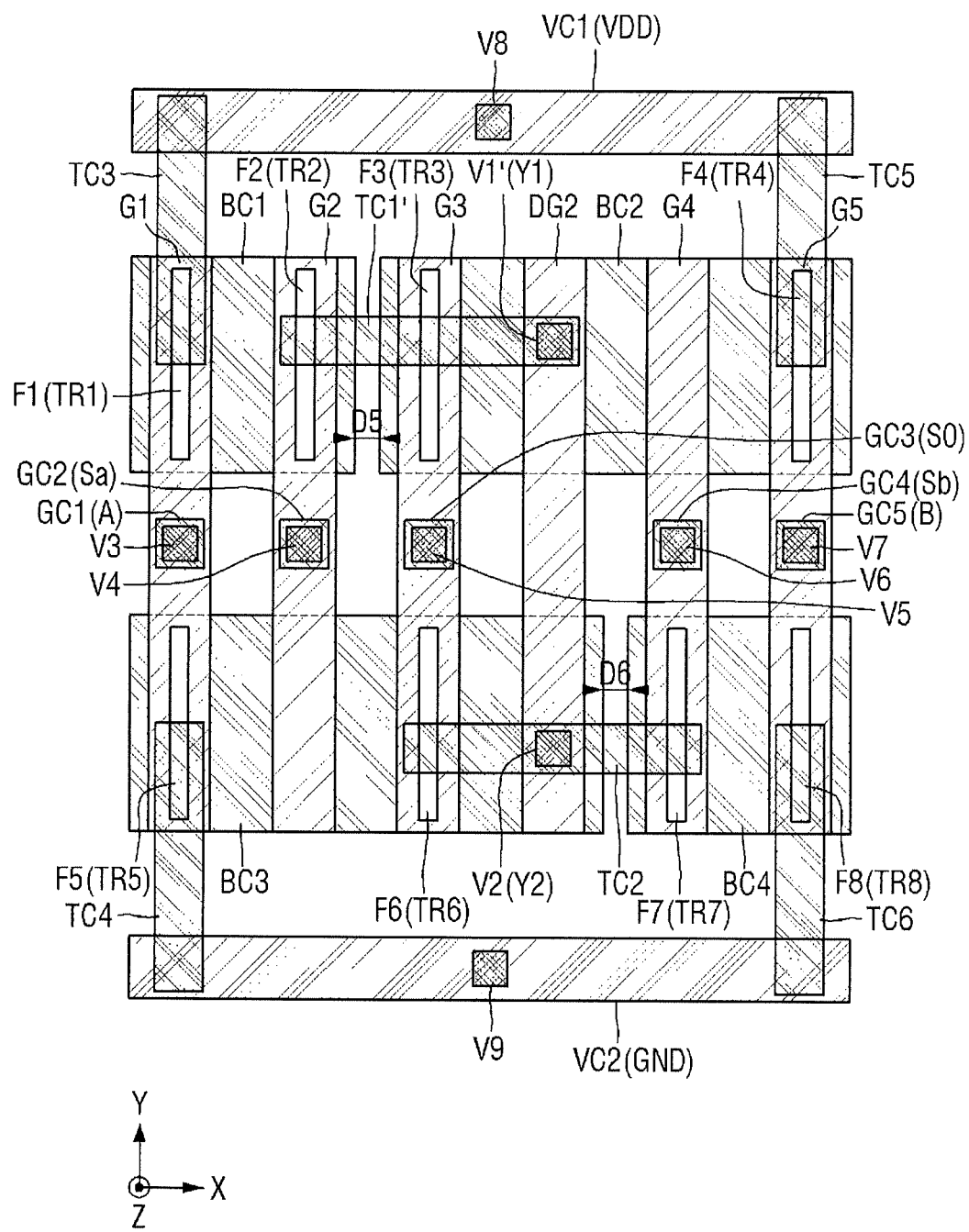
FIG. 10 is a layout diagram of a semiconductor device according to some embodiments.

FIG. 10 is a layout diagram of a semiconductor device according to some embodiments. Referring to FIG. 10, a semiconductor device according to current embodiments is different from a semiconductor device according to some embodiments of FIG. 5 in that a first dummy gate electrode DG1 is omitted. Accordingly, first through fifth gate electrodes G1 through G5 and a second dummy gate electrode DG2 of a semiconductor device according to current embodiments may be arranged in the order of the first gate electrode G1, the second gate electrode G2, the third gate electrode G3, the second dummy gate electrode DG2, the fourth gate electrode G4 and the fifth gate electrode G5 in the first direction X.

A distance in the first direction X between a first bottom contact BC1 and a second bottom contact BC2 may be a fifth distance d5, and a distance in the first direction X between a third bottom contact BC3 and a fourth bottom contact BC4 may be a sixth distance d6.

Since the first dummy gate electrode DG1 is not provided, a first top contact TC1' may be formed on the second gate electrode G2, the third gate electrode G3 and the second dummy gate electrode DG2. The first top contact TC1' may also be connected directly to a second active fin F2 and a third active fin F3.

A first via V1' may be located on the first top contact TC1' on the second dummy gate electrode DG2. Accordingly, the first via V1' and a second via V2 may be aligned with each other in the second direction Y.

If a wiring that connects the first via V1' and the second via V2 is formed, a gate connection circuit in which the node Y1 and the node Y2 of FIG. 1 are connected to each other can be realized.

In addition, a wiring can be formed to separate the Y1 and node Y2s from each other. Since this wiring can be formed in one space of the second dummy gate electrode DG2, the space can be efficiency used.

A semiconductor device according to the current embodiments can realize a gate connection circuit using only a total of six gate electrode patterns (the first through fifth gate electrodes G1 through G5) and the second dummy gate electrode DG2. Therefore, the degree of integration of the semiconductor device can be greatly improved.

Hereinafter, a semiconductor device according to some embodiments will be described with reference to FIGS. 10 and 11. For simplicity, a description of elements substantially identical to those described above will be given briefly or omitted FIG. 11 is a layout diagram of a semiconductor device according to some embodiments.

Figure 11:
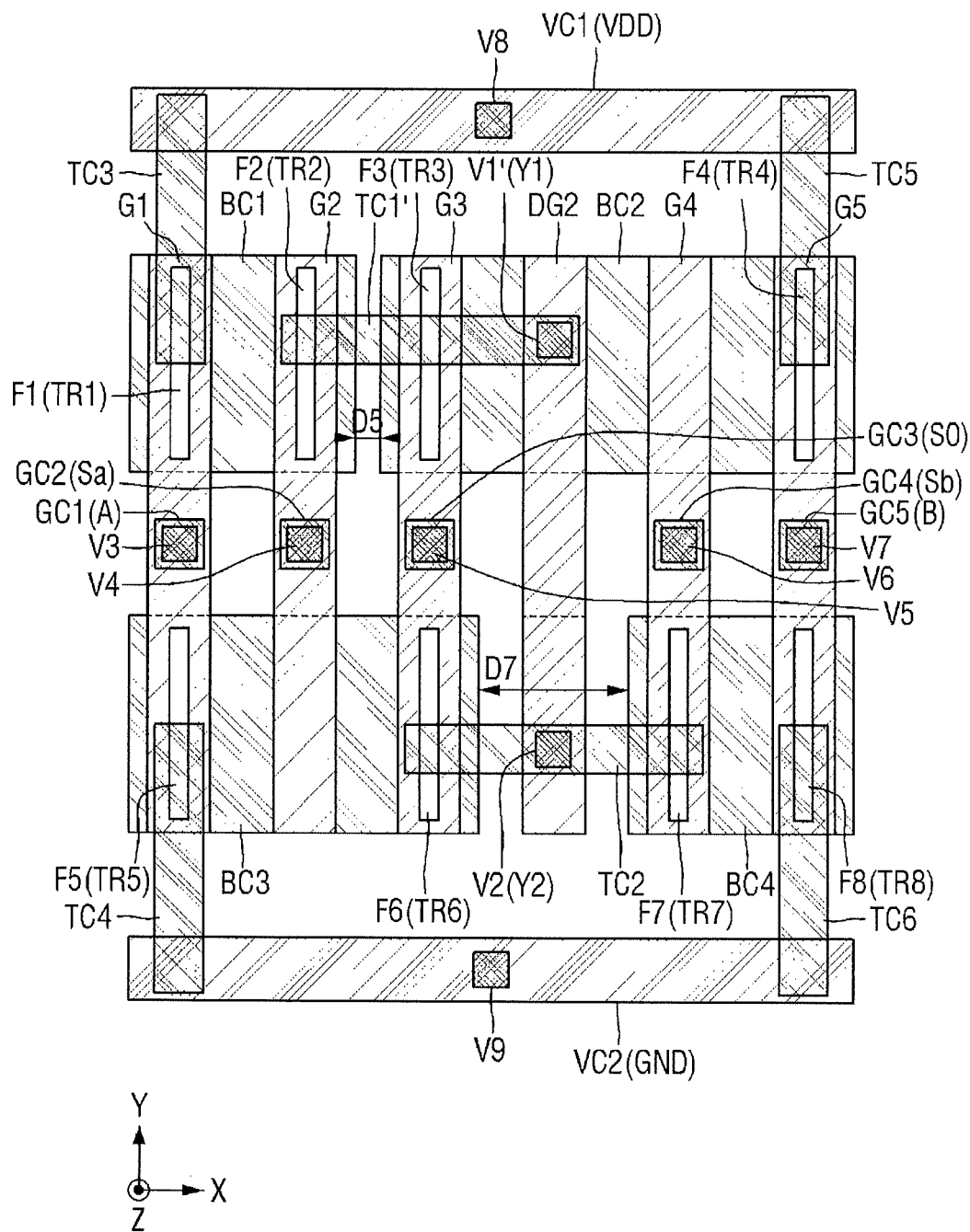
FIG. 11 is a layout diagram of a semiconductor device according to some embodiments.

Referring to FIG. 11, a second dummy gate electrode DG2 of a semiconductor device according to some embodiments may not overlap a third bottom contact BC3.

In particular, since the second dummy gate electrode DG2 is an element formed to secure a space margin of the third bottom contact BC3 and a fourth bottom contact BC4, the third bottom contact BC3 can be formed to have a space margin equal to a width of the second dummy gate electrode DG2 and a part of a pitch with another gate electrode.

In particular, the third bottom contact BC3 can be formed regardless of whether it overlaps the second dummy gate electrode DG2. A semiconductor device according to some embodiments can operate normally even when a pattern that separates the third bottom contact BC3 and the fourth bottom contact BC4 is as wide as a seventh distance d7 greater than the sixth distance d6 of FIG. 10 due to the misalignment of a mask.

Hereinafter, a semiconductor device according to some embodiments will be described with reference to FIG. 12.

For simplicity, a description of elements substantially identical to those described above will be given briefly or omitted.

Figure 12:
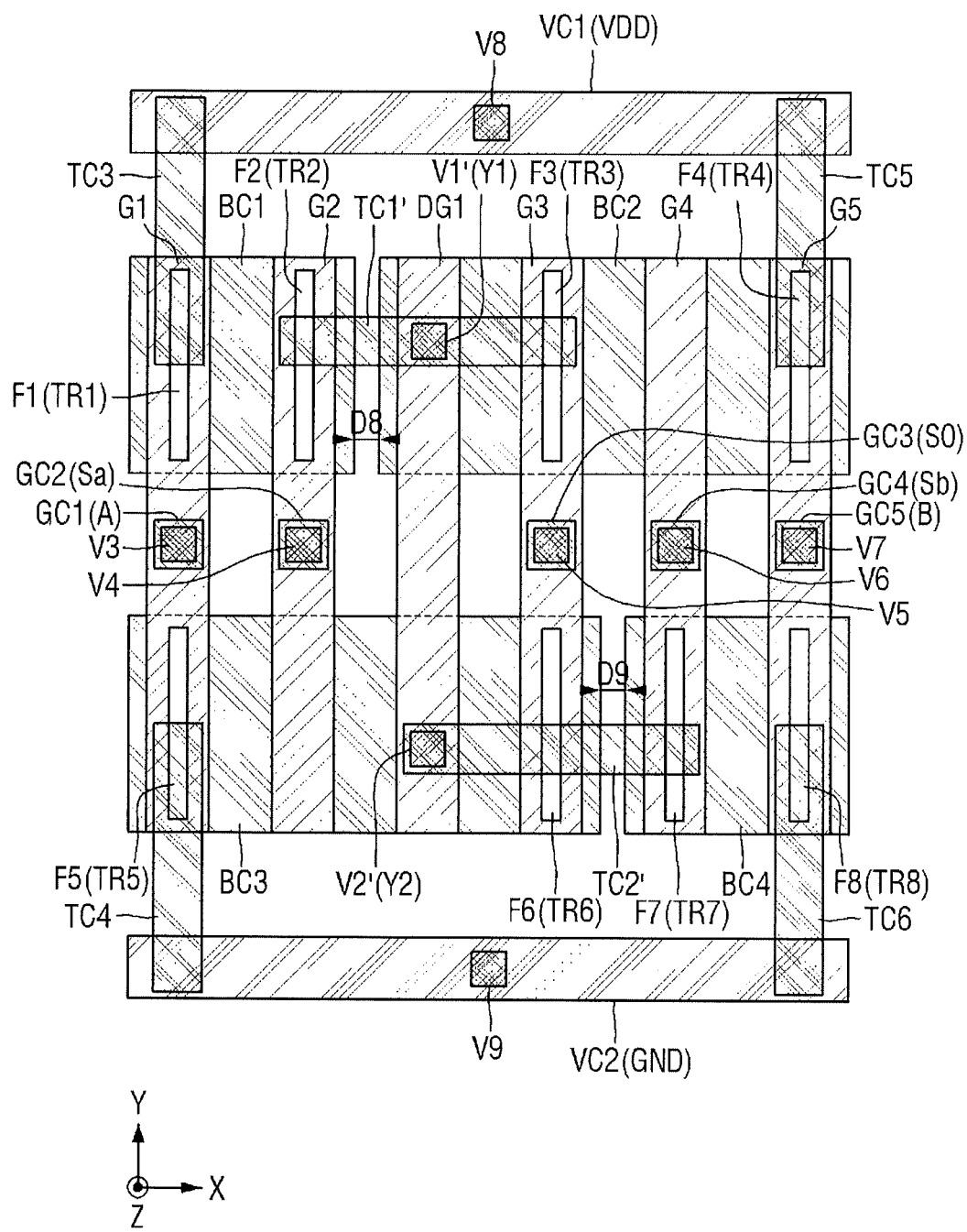
FIG. 12 is a layout diagram of a semiconductor device according to some embodiments.

FIG. 12 is a layout diagram of a semiconductor device according to some embodiments. Referring to FIG. 12, a semiconductor device according to the current embodiments is different from a semiconductor device according to some embodiments of FIG. 5 in that a second dummy gate electrode DG2 is omitted. Accordingly, first through fifth gate electrodes G1 through G5 and a first dummy gate electrode DG1 of a semiconductor device according to current embodiments may be arranged in the order of the first gate electrode G1, the second gate electrode G2, the first dummy gate electrode DG1, the third gate electrode G3, the fourth gate electrode G4 and the fifth gate electrode G5 in the first direction X.

A distance in the first direction X between a first bottom contact BC1 and a second bottom contact BC2 may be an eighth distance d8, and a distance in the first direction X between a third bottom contact BC3 and a fourth bottom contact BC4 may be a ninth distance d9.

Since the second dummy gate electrode DG2 is not provided, a second top contact TC2' may be formed on the third gate electrode G3, the fourth gate electrode G4 and the first dummy gate electrode DG1. The second top contact TC2' may also be connected directly to a sixth active fin F6 and a seventh active fin F7.

A second via V2' may be located on the second top contact TC2' on the first dummy gate electrode DG1. Accordingly, a first via V1 and the second via V2' may be aligned with each other in the second direction Y.

If a wiring that connects the first via V1 and the second via V2' is formed, a gate connection circuit in which the node Y1 and the node Y2 of FIG. 1 are connected to each other can be realized.

In addition, a wiring can be formed to separate the Y1 and node Y2s from each other. Since this wiring can be formed in one space of the first dummy gate electrode DG 1, the space can be efficiency used.

A semiconductor device according to current embodiments can realize a gate connection circuit using only a total of six gate electrode patterns (the first through fifth gate electrodes G1 through G5) and the first dummy gate electrode DG1. Therefore, the degree of integration of the semiconductor device can be greatly improved.

The embodiments of FIGS, 10 and 12 are embodiments in which either of dummy gate electrodes symmetrical to each other is removed. Therefore, the same circuit can be implemented by selecting a desired layout in consideration of the arrangement of wirings.

Hereinafter, a semiconductor device according to some embodiments will be described with reference to FIGS. 12 and 13. For simplicity, a description of elements substantially identical to those described above will be given briefly or omitted.

Figure 13:
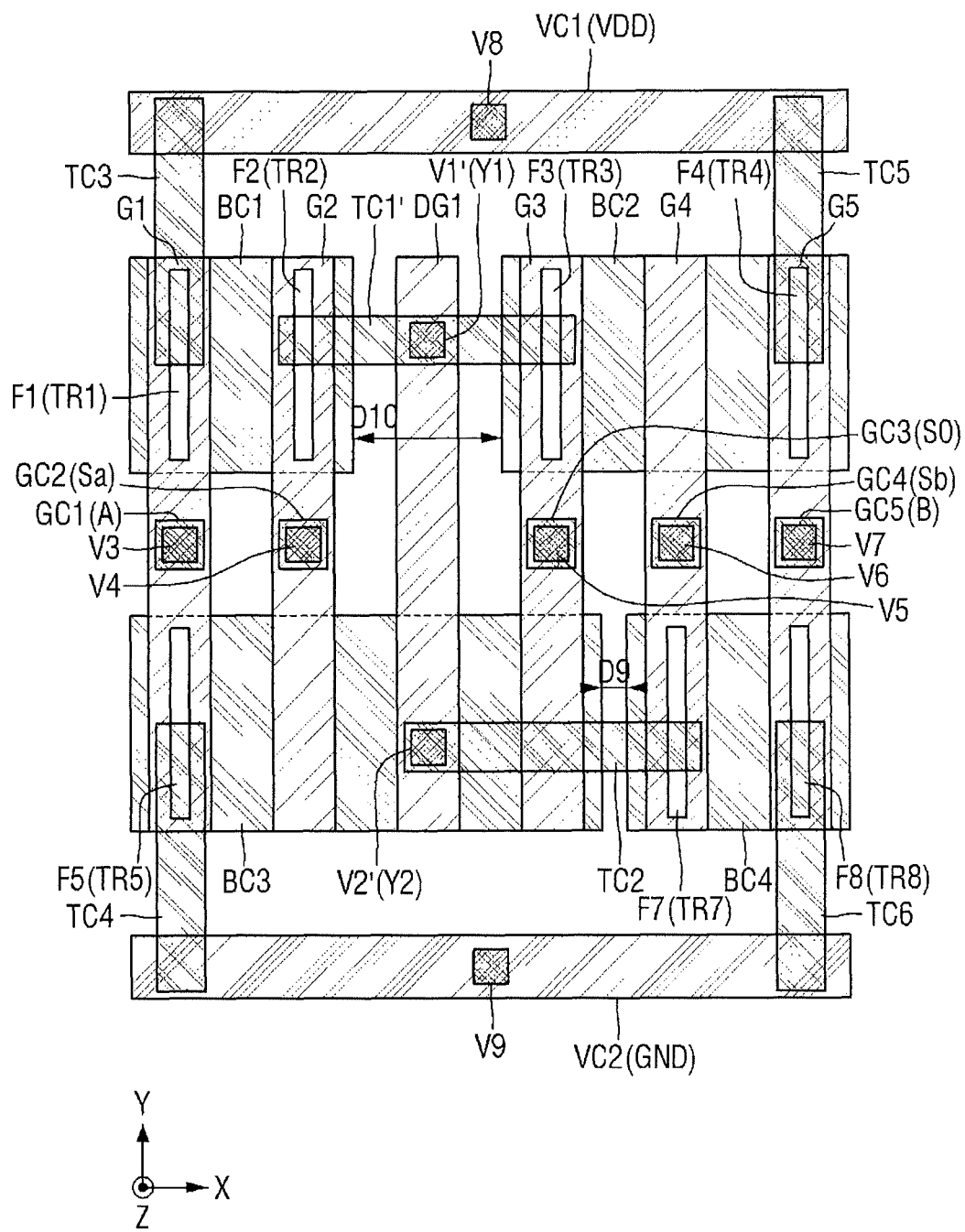
FIG. 13 is a layout diagram of a semiconductor device according to some embodiments.

FIG. 13 is a layout diagram of a semiconductor device according to some embodiments.

Referring to FIG. 13, a first dummy gate electrode DG1 of a semiconductor device according to some embodiments may not overlap a second bottom contact BC2.

In particular, since the first dummy gate electrode DG1 is an element formed to secure a space margin of a first bottom contact BC1 and the second bottom contact BC2, the second bottom contact BC2 can be formed to have a space margin equal to a width of the first dummy gate electrode DG1 and a part of a pitch with another gate electrode.

In particular, the second bottom contact BC2 can be formed regardless of whether it overlaps the first dummy gate electrode DG1. A semiconductor device according to some embodiments can operate normally even when a pattern that separates the first bottom contact BC1 and the second bottom contact BC2 is as wide as a tenth distance d10 greater than the eighth distance d8 of FIG. 12 due to the misalignment of a mask Hereinafter, a semiconductor device according to some embodiments will be described with reference to FIG. 14. For simplicity, a description of elements substantially identical to those described above will be given briefly or omitted.

Figure 14:
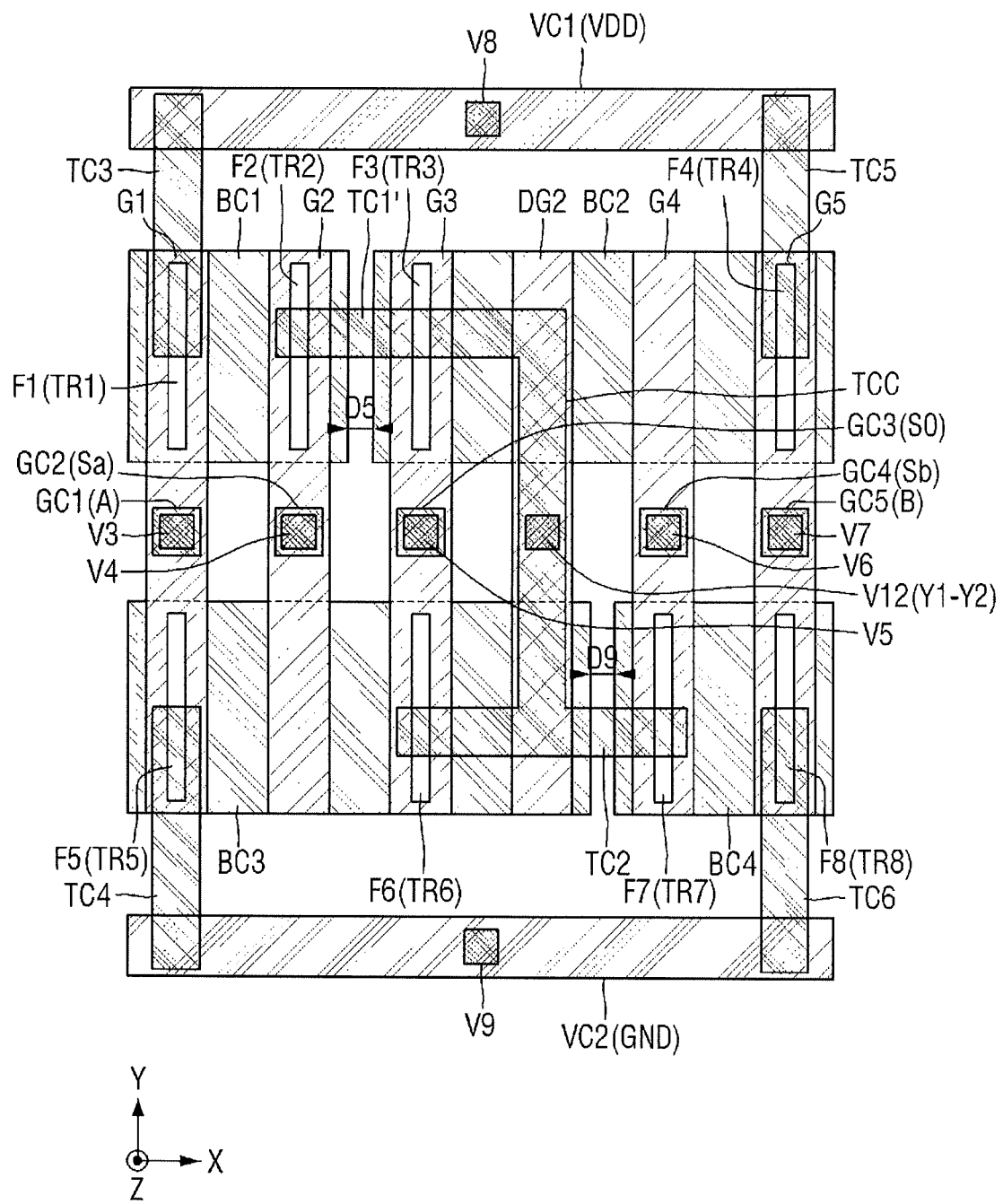
FIG. 14 is a layout diagram of a semiconductor device according to some embodiments.

FIG. 14 is a layout diagram of a semiconductor device according to some embodiments. Referring to FIG. 14, a semiconductor device according to some embodiments includes a top contact connecting portion TCC connecting a first top contact TC1' and a second top contact TC2.

The top contact connecting portion TCC may extend in the second direction Y. The top contact connecting portion TCC may integrally connect the first top contact TC1' and the second top contact TC2. Accordingly, a contact in which the first top contact TC1', the second top contact TC2, and the top contact connecting portion TCC are integrated with each other can be formed.

If the first top contact TC1' and the second top contact TC2 are connected together, two vias are not necessary. Therefore, only a twelfth via V12 may be formed. The twelfth via V12 may be aligned with the existing third through seventh vias V3 through V7 in the first direction X.

In this case, a circuit in which the Y1 and node Y2s of FIG. 1 are connected to each other can be realized. Therefore, the current embodiments can realize a cross gate connection circuit in which two gate connections are formed.

Hereinafter, a semiconductor device according to some embodiments will be described with reference to FIGS. 15 and 16. For simplicity, a description of elements substantially identical to those described above will be given briefly or omitted.

Figure 15:
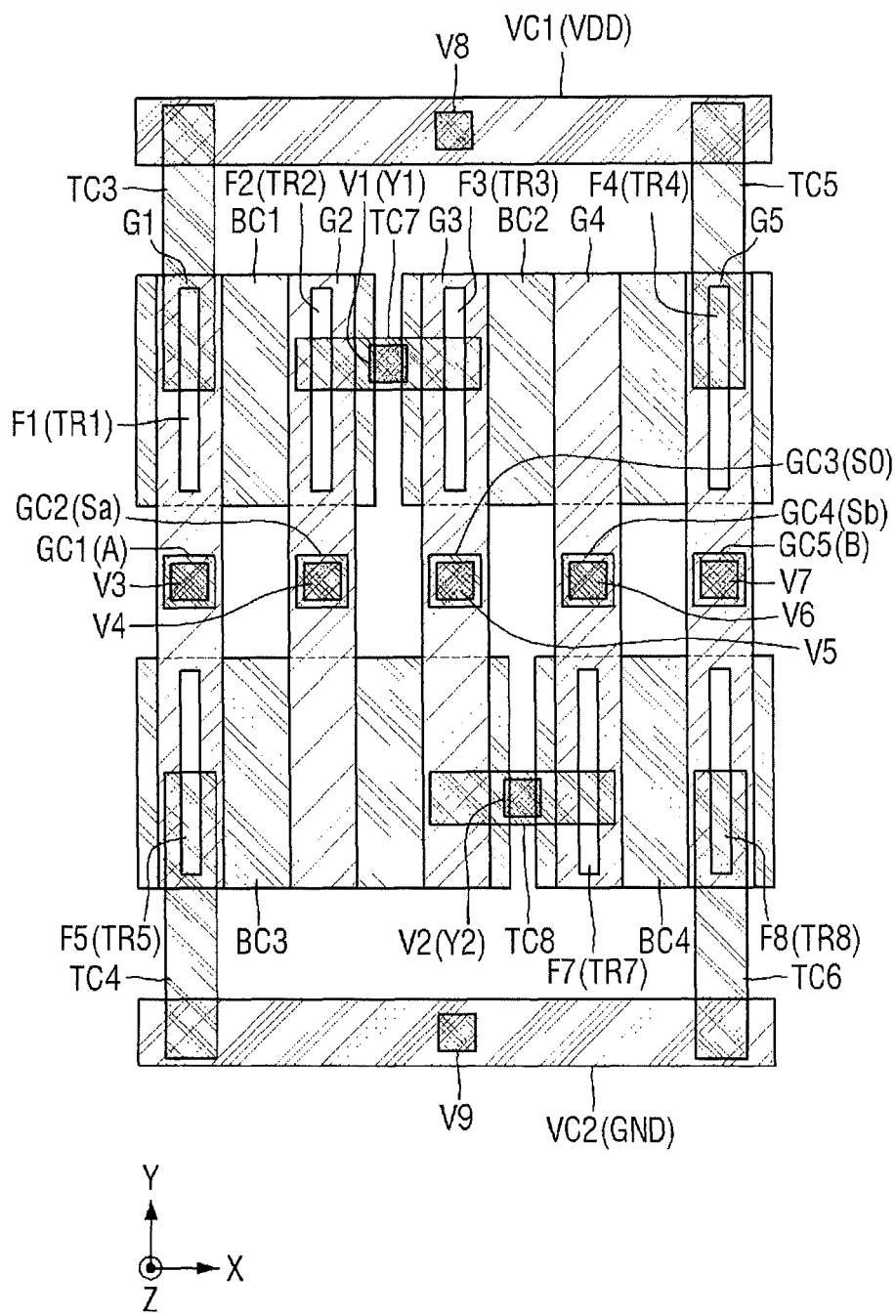
FIG. 15 is a layout diagram of a semiconductor device according to some embodiments.
Figure 16:
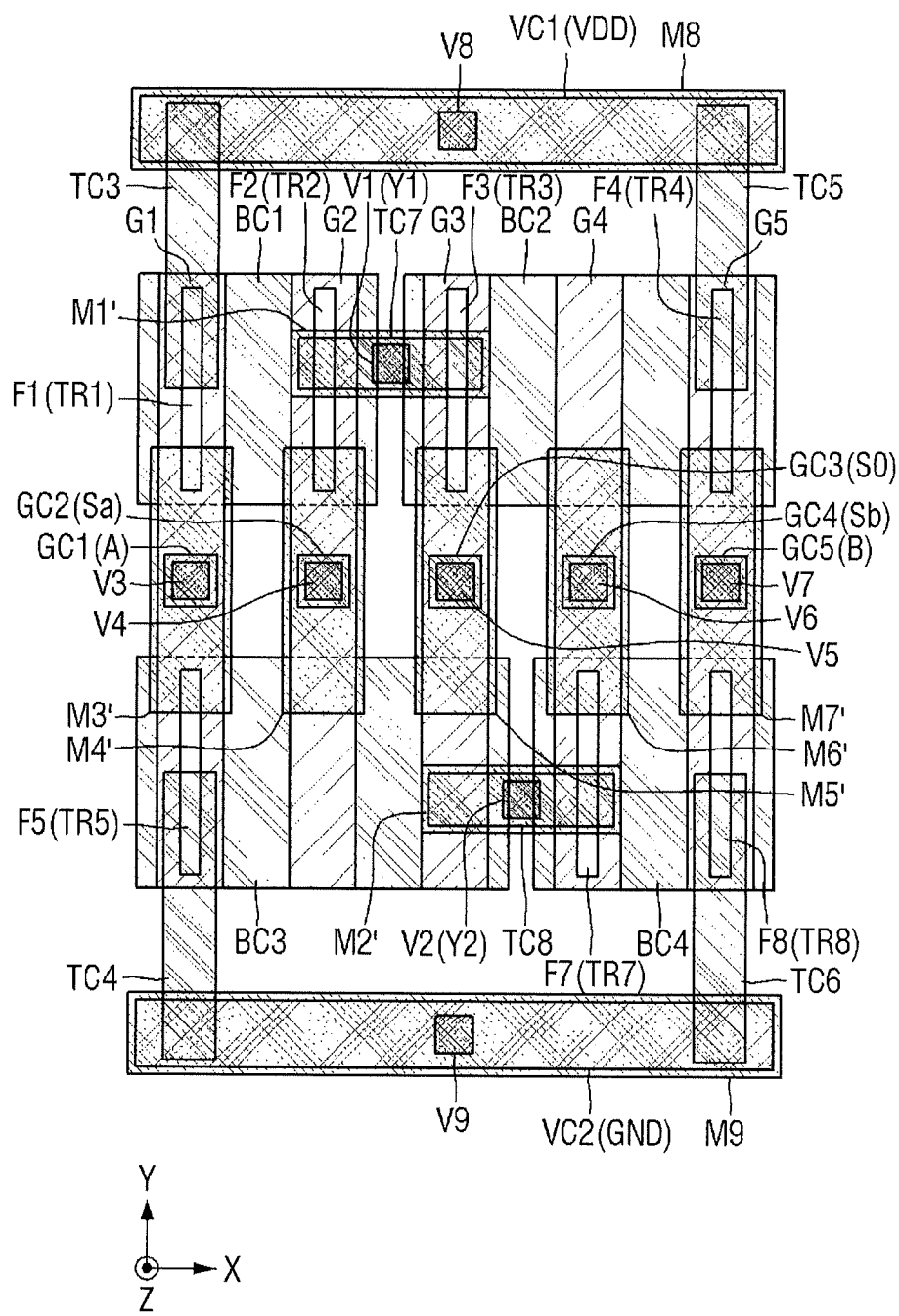
FIG. 16 is a layout diagram illustrating the structure of a level higher than that of the layout diagram of FIG. 15 in detail.

FIG. 15 is a layout diagram of a semiconductor device according to some embodiments, and FIG. 16 is a layout diagram illustrating the structure of a level higher than that of the layout diagram of FIG. 15 in detail. The current embodiments will be described sequentially from the lowest level.

First, referring to FIG. 15, a semiconductor device according to the current embodiments is different from a semiconductor device according to some embodiments of FIGS. 1 through 5 in that first and second dummy gate electrodes DG1 and DG2 are omitted. Accordingly, first through fifth gate electrodes G1 through G5 of a semiconductor device according to current embodiments may be arranged in the order of the first gate electrode G1, the second gate electrode G2, the third gate electrode G3, the fourth gate electrode G4 and the fifth gate electrode G5 in the first direction X.

A semiconductor device according to current embodiments may include a seventh top contact TC7 and an eighth top contact TC8. The seventh top contact TC7 may be formed on a second active fin F2, a third active fin F3, the second gate electrode G2 and the third gate electrode G3. The seventh top contact TC7 may extend in the first direction X. The seventh top contact TC7 may electrically connect the second active fin F2 and the third active fin F3.

The eighth top contact TC8 may be formed on a sixth active fin F6, a seventh active fin F7, the third gate electrode G3 and the fourth gate electrode G4. The eighth top contact TC8 may extend in the first direction X. The eighth top contact TC8 may electrically connect the sixth active fin F6 and the seventh active fin F7.

A first via V1 may be formed on the seventh top contact TC7 on the second gate electrode G2 and the third gate electrode G3, and a second via V2 may be formed on the eighth top contact TC8 on the third gate electrode G3 and the fourth gate electrode G4. The first via V1 and the second via V2 may not be aligned with third through seventh vias V3 through V7 in the first direction X.

The first via V1 may be located between a first bottom contact BC1 and a second bottom contact BC2 in the first direction X. The second via V2 may be located between a third bottom contact BC3 and a fourth bottom contact BC4 in the first direction X.

Next, referring to FIG. 16, a semiconductor device according to current embodiments may include first through seventh wirings M1' through M7'. The first through seventh wirings M1' through M7' may be formed to electrically insulate the first through seventh vias V7 from each other. For example, as illustrated in FIG. 16, the third through seventh wirings M3' through M7' may extend in the second direction Y but may be shorter than the first through fifth gate electrodes G1 through G5. The third through seventh wirings M3' through M7' may be spaced apart from each other in the first direction X.

The first wiring M1' may extend in the first direction X. The first wiring M may be formed on the first via V1. The first wiring M1' may be spaced apart from ends of the fourth wiring M4' and the fifth wiring M5' in the second direction Y.

The second wiring M2' may extend in the first direction X. The second wiring M2' may be formed on the second via V2. The second wiring M2' may be spaced apart from ends of the fifth wiring M5' and the sixth wiring M6' in the second direction Y.

The arrangement illustrated in FIG. 16 is only one example of a semiconductor device according to some embodiments. The current embodiments can include all arrangements of the first through seventh wirings M1' through M7' that can electrically insulate the first through seventh vias V7.

The current embodiments are embodiments in which only five gate electrodes are formed without a dummy gate electrode. In particular, since a semiconductor device according to current embodiments is a circuit that can implement a gate connection circuit in the smallest area, the degree of integration of the semiconductor device can be greatly improved. Accordingly, it is possible to reduce the production cost and provide a semiconductor device with high performance for the same area.

Hereinafter, a semiconductor device according to some embodiments will be described with reference to FIG. 17. For simplicity, a description of elements substantially identical to those described above will be given briefly or omitted.

Figure 17:
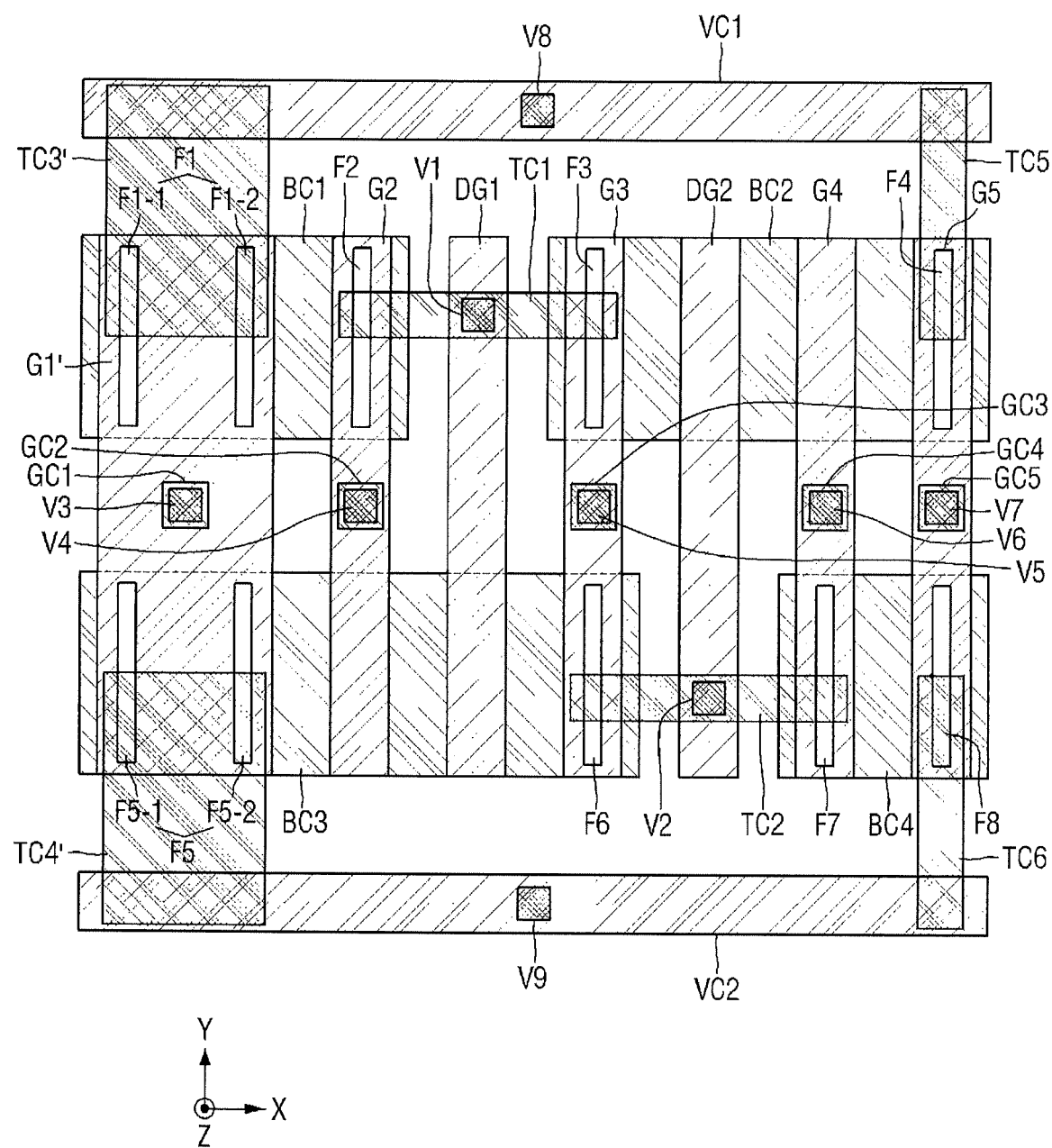
FIG. 17 is a layout diagram of a semiconductor device according to some embodiments.

FIG. 17 is a layout diagram of a semiconductor device according to some embodiments. Referring to FIG. 17, a first gate electrode of a semiconductor device according to some embodiments may be wider than second through fifth gate electrodes G2 through G5 in the first direction X. In particular, the first gate electrode G1' may actually have a width equal to 2CPP, a pitch of two gate electrodes. In other words, the width of the first gate electrode G1' may be equal to the sum of widths of two gate electrodes and a pitch between the two gate electrodes.

A first active fin F1 may include two active fins. Specifically, the first active fin F1 may include a $(1\text{-}1)^{th}$ active fin F1-1 and a $(1\text{-}2)^{th}$ active fin F1-2. The $(1\text{-}1)^{th}$ active fin F1-1 and the $(1\text{-}2)^{th}$ active fin F1-2 may extend in the second direction Y and may be spaced apart from each other in the first direction X.

Similarly, a fifth active fin F5 may include two active fins. Specifically, the fifth active fin F5 may include a $(5\text{-}1)^{th}$ active fin F5-1 and a $(5\text{-}2)^{th}$ active fin F5-2. The $(5\text{-}1)^{th}$ active fin F5-1 and the $(5\text{-}2)^{th}$ active fin F5-2 may extend in the second direction Y and may be spaced apart from each other in the first direction X.

In addition, since a third top contact TC3' should contact both the $(1\text{-}1)^{th}$ active fin F1-1 and the $(1\text{-}2)^{th}$ active fin F1-2, a width of the third top contact TC3' in the first direction X may be increased. Similarly, since a fourth top contact TC4' should also contact both the $(5\text{-}1)^{th}$ active fin F5-1 and the $(5\text{-}2)^{th}$ active fin F5-2, a width of the fourth top contact TC4' in the first direction X may be increased.

A first gate contact GC1 and a third via V3 may be located between extension lines of the $(1\text{-}1)^{th}$ active fin F1-1 and the $(1\text{-}2)^{th}$ active fin F1-2 in the first direction X. However, the inventive concept is not limited to this case.

The current embodiments can implement a transistor composed of two sub-transistors using a gate electrode two or more times wider and two active fins, thereby improving the performance and operation speed of the transistor. In particular, in the current embodiments, each of the first transistor TR1 and the fifth transistor TR5 (see FIG. 1) formed respectively by the first active fin F1 and the fifth active fin F5 is composed of two sub-transistors, Therefore, better performance can be achieved due to higher operation speed.

Although two sub-transistors constitute one conventional transistor in the drawing, the number of sub-transistors constituting one conventional transistor can be increased within a range satisfying design restrictions. Therefore, the first gate electrode G1' of a semiconductor device according to some embodiments can be formed thick to surround two or more active fins.

Hereinafter, a semiconductor device according to some embodiments will be described with reference to FIG. 18. For simplicity, a description of elements substantially identical to those described above will be given briefly or omitted.

Figure 18:
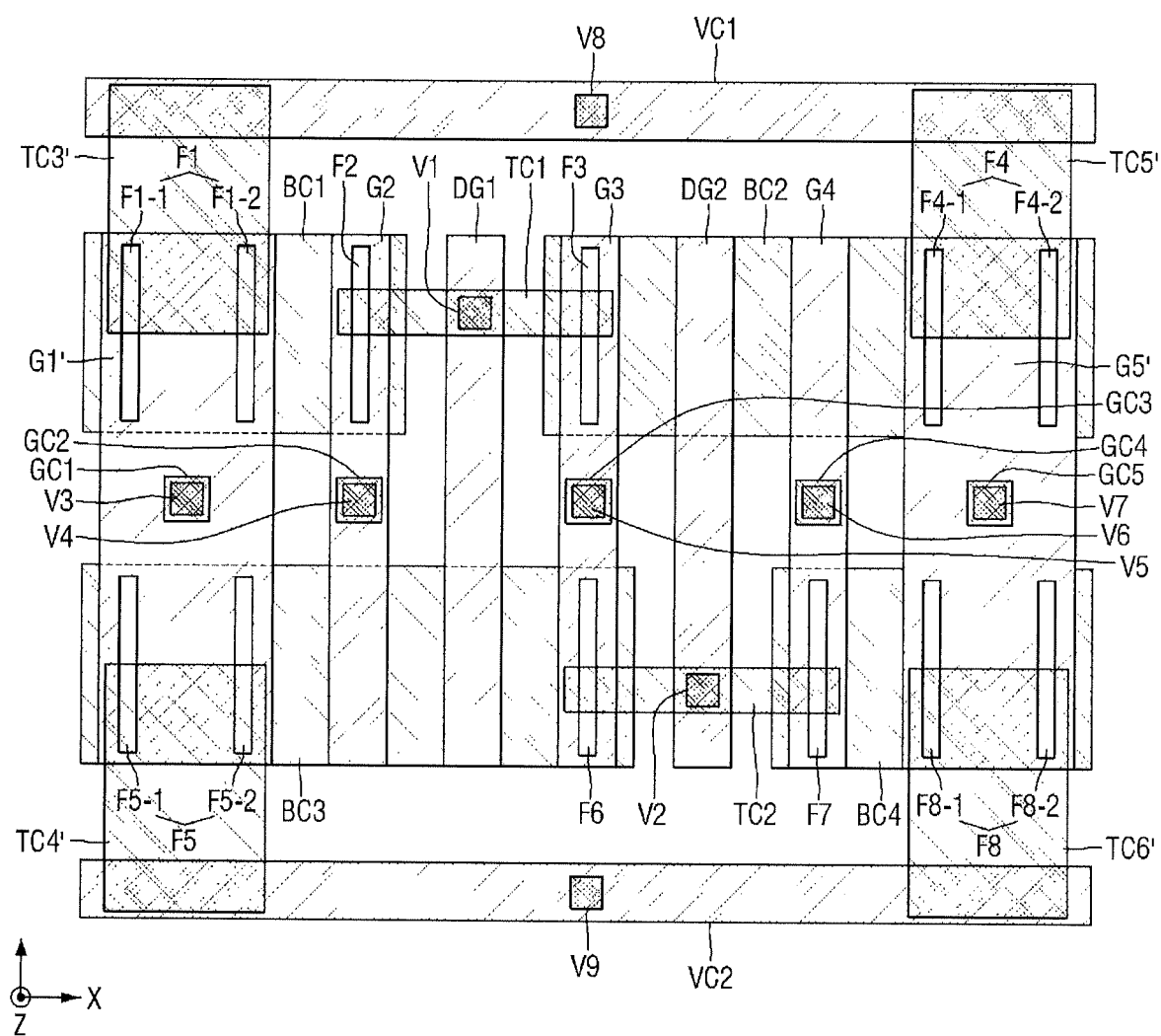
FIG. 18 is a layout diagram of a semiconductor device according to some embodiments.

FIG. 18 is a layout diagram of a semiconductor device according to some embodiments. Referring to FIG. 18, a fifth gate electrode G5' of a semiconductor device according to some embodiments is wider than second through fourth gate electrodes G2 through G4 in the first direction X. In particular, the tfth gate electrode G5' may actually have a width equal to 2CPP, a pitch of two gate electrodes. In other words, the width of the fifth gate electrode G5' may be equal to the sum of widths of two gate electrodes and a pitch between the two gate electrodes.

Accordingly, a fourth active fin F4 may include two active fins, Specifically, the fourth active fin F4 may include a $(4\text{-}1)^{th}$ active fin F4-1 and a $(4\text{-}2)^{th}$ active fin F4-2. The $(4\text{-}1)^{th}$ active fin F4-1 and the $(4\text{-}2)^{th}$ active fin F4-2 may extend in the second direction Y and may be spaced apart from each other in the first direction X.

Similarly, an eighth active fin F8 may include two active fins. Specifically, the eighth active fin F8 may include a $(8\text{-}1)^{th}$ active fin F8-1 and a $(8\text{-}2)^{th}$ active fin F8-2. The $(8\text{-}1)^{th}$ active fin F8-1 and the $(8\text{-}2)^{th}$ active fin F8-2 may extend in the second direction Y and may be spaced apart from each other in the first direction X.

In addition, since a fifth top contact TC5' should contact both the $(4\text{-}1)^{th}$ active fin F4-1 and the $(4\text{-}2)^{th}$ active fin F4-2, a width of the fifth top contact TC5' in the first direction X may be increased. Similarly, since a sixth top contact TC6' should also contact both the $(8\text{-}1)^{th}$ active fin F8-1 and the $(8\text{-}2)^{th}$ active fin F8-2, a width of the sixth top contact TC6' in the first direction X may be increased.

A fifth gate contact GC5 and a seventh via V7 may be located between extension lines of the $(4\text{-}1)^{th}$ active fin F4-1 and the $(4\text{-}2)^{th}$ active fin F4-2 in the first direction X. However, the inventive concept is not limited to this case.

The current embodiments implement a transistor composed of two sub-transistors using a gate electrode two or more times wider and two fins, thereby improving the performance and operation speed of the transistor. In particular, this modification is made in a symmetrical manner to maintain the symmetry of the whole cell.

Cell symmetry is a factor that affects performance (such as fine threshold voltages) of adjacent elements. The performance of elements inside an asymmetrical cell may be different. Therefore, the lifetime of the asymmetrical cell can be shortened. A modification for improving performance may be applied symmetrically to maintain the performance dispersion of cells constituting a semiconductor device, thereby enabling the semiconductor device to operate stably and for a long time.

A modification illustrated in the drawing is an increase in the widths of a first gate electrode G1' and the fifth gate electrode G5'. However, the inventive concept is not limited to this case. Therefore, any gate electrode of a semiconductor device according to some embodiments can be patterned thicker to form a plurality of transistors for performance improvement.

Hereinafter, a semiconductor device according to some embodiments will be described with reference to FIGS. 1 and 19. For simplicity, a description of elements substantially identical to those described above will be given briefly or omitted.

Figure 19:
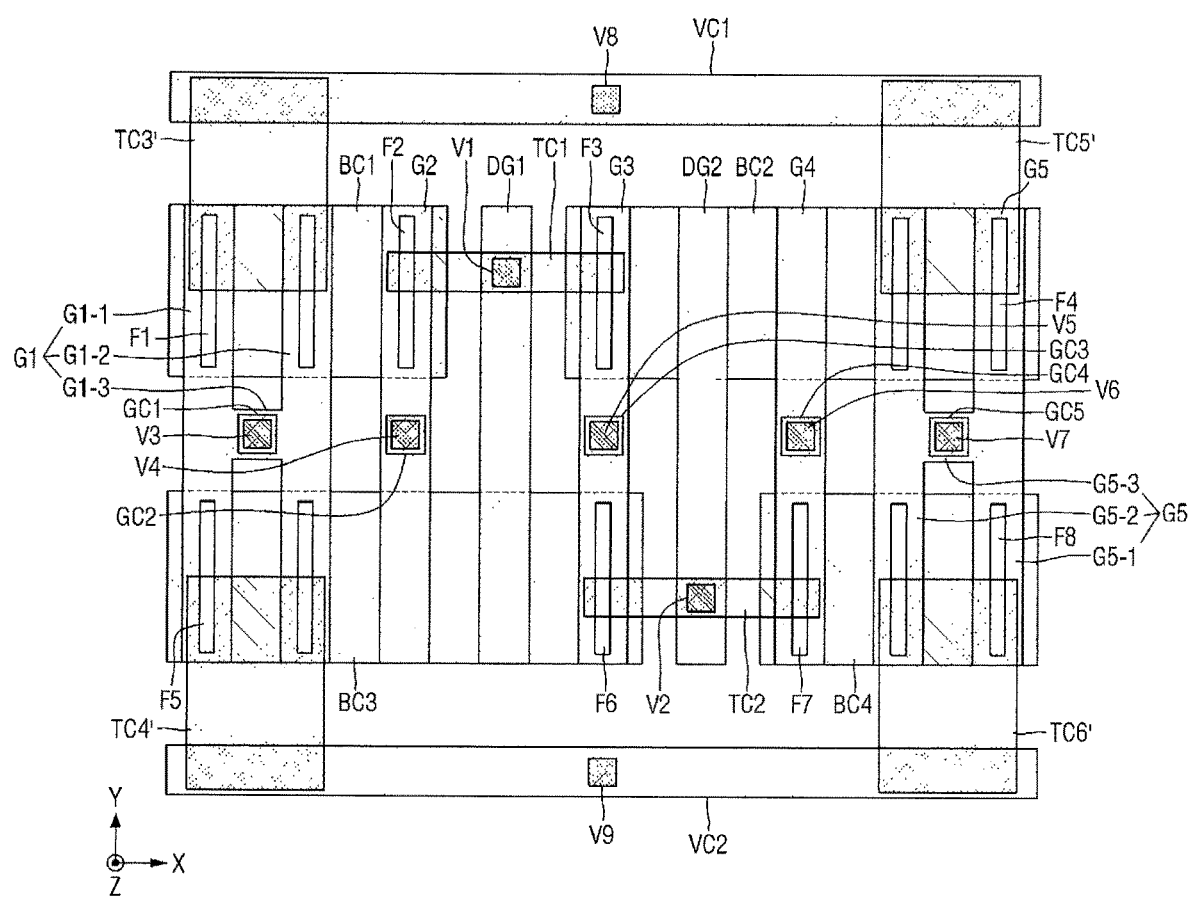
FIG. 19 is a layout diagram of a semiconductor device according to some embodiments.

FIG. 19 is a layout diagram of a semiconductor device according to some embodiments. Referring to FIG. 19, a first gate electrode G1 of a semiconductor device according to some embodiments may be H-shaped. Specifically, the first gate electrode G1 may include a $(1\text{-}1)^{th}$ gate electrode G1-1, a $(1\text{-}2)^{th}$ gate electrode G1-2, and a $(1\text{-}3)^{th}$ gate electrode G1-3. The $(1\text{-}1)^{th}$ gate electrode G1-1 and the $(1\text{-}2)^{th}$ gate electrode G1-2 may extend in the second direction Y and may be spaced apart from each other in the first direction X. The $(1\text{-}1)^{th}$ gate electrode G1-1 and the $(1\text{-}2)^{th}$ gate electrode G1-2 may be formed in the same shape as second through fourth gate electrodes G2 through G4.

The $(1\text{-}3)^{th}$ gate electrode G1-3 may connect the $(1\text{-}1)^{th}$ gate electrode G1-1 and the $(1\text{-}2)^{th}$ gate electrode G1-2. The $(1\text{-}3)^{th}$ gate electrode G1-3 may extend in the first direction X, and the $(1\text{-}1)^{th}$ gate electrode G1-1, the $(1\text{-}2)^{th}$ gate electrode G1-2, the $(1\text{-}3)^{th}$ gate electrode G1-3 may be integrally formed with each other.

A $(1\text{-}1)^{th}$ active fin F1-1 may be surrounded by the $(1\text{-}1)^{th}$ gate electrode G1-1, and a $(1\text{-}2)^{th}$ active fin F1-2 may be surrounded by the $(1\text{-}2)^{th}$ gate electrode G1-2. Likewise, a $(5\text{-}1)^{th}$ active fin F5-1 may be surrounded by the $(1\text{-}1)^{th}$ gate electrode G1-1, and a $(5\text{-}2)^{th}$ active fin F5-2 may be surrounded by the $(1\text{-}2)^{th}$ gate electrode G1-2.

A first gate contact GC1 and a third via V3 may be located on the $(1\text{-}3)^{th}$ gate electrode G1-3 between extension lines of the $(1\text{-}1)^{th}$ active fin F1-1 and the $(1\text{-}2)^{th}$ active fin F1-2 in the first direction X. However, the inventive concept is not limited to this case.

A fifth gate electrode G5 may include a (5-1)$^{th}$ gate electrode G5-1, a (5-2)$^{th}$ gate electrode G5-2, and a (5-3)$^{th}$ gate electrode G5-3. The (5-1)$^{th}$ gate electrode G5-1 and the (5-2)$^{th}$ gate electrode G5-2 may extend in the second direction Y and may be spaced from each other in the first direction X.

The (5-3)$^{th}$ gate electrode G5-3 may connect the (5-1)$^{th}$ gate electrode G5-1 and the (5-2)$^{th}$ gate electrode G5-2. The (5-3)$^{th}$ gate electrode G5-3 may extend in the first direction X, and the (5-1)$^{th}$ gate electrode G5-1, the (5-2)$^{th}$ gate electrode G5-2, and the (5-3)$^{th}$ gate electrode G5-3 may be integrally formed with each other.

A (4-1)$^{th}$ active fin F4-1 may be surrounded by the (5-1)$^{th}$ gate electrode G5-1, and a (4-2)$^{th}$ active fin F4-2 may be surrounded by the (5-2)$^{th}$ gate electrode G5-2. Similarly, a (8-1)$^{th}$ active fin F8-1 may be surrounded by the (5-1)$^{th}$ gate electrode G5-1, and a (8-2)$^{th}$ active fin F8-2 may be surrounded by the (5-2)$^{th}$ gate electrode G5-2.

A fifth gate contact GC5 and a seventh via V7 may be located on the (5-3)$^{th}$ gate electrode G5-3 between extension lines of the (4-1)$^{th}$ active fin F4-1 and the (4-2)$^{th}$ active fin F4-2 in the first direction X. However, the inventive concept is not limited to this case.

A semiconductor device according to current embodiments has a structure in which transistors composed of one active fin and one gate electrode are spaced apart from each other in the first direction X. Therefore, transistors having characteristics not greatly different from those of other conventional transistors can be formed. Accordingly, it is possible to provide a semiconductor device which can be prepared against the unexpected deterioration of performance or durability of transistors and, further, has higher reliability.

What is claimed is:

1. A semiconductor device comprising:
a substrate;
first, second, third and fourth bottom contacts in the substrate;
first, second, third and fourth active fins on respective ones of the first, second, third and fourth bottom contacts, the second and third active fins overlapping in a first direction;
first, second and third gate electrodes extending lengthwise in the first direction, the first and second gate electrodes disposed on side surfaces of respective ones of the first and fourth active fins and the third gate electrode disposed on side surfaces of the second and third active fins;
a first top contact on the first and second active fins; and
a second top contact on the third and fourth active fins.

2. The semiconductor device of claim 1,
wherein the first and second bottom contacts overlap in a second direction and are spaced apart from each other in the second direction,
wherein the third and fourth bottom contacts overlap in the second direction and are spaced apart from each other in the second direction,
wherein the first and second bottom contacts are spaced apart from the third and fourth bottom contacts in the first direction,
wherein the second and third bottom contacts overlap in the first direction, and
wherein the first and fourth bottom contacts do not overlap in the first direction.

3. The semiconductor device of claim 1, further comprising first, second, third and fourth source/drain regions between the first, second, third and fourth bottom contacts and the first, second, third and fourth active fins, respectively.

4. The semiconductor device of claim 1, further comprising first, second, third and fourth source/drain regions between the first and second top contacts and the first, second, third and fourth active fins.

5. The semiconductor device of claim 4, wherein the first and second source/drain regions are connected by the first top contact and wherein the third and fourth source/drain regions are connected by the second top contact.

6. The semiconductor device of claim 1, wherein the first and second active fins have n-type conductivity type and wherein the third and fourth active fins have p-type conductivity type.

7. The semiconductor device of claim 1, further comprising a first dummy gate electrode extending lengthwise in the first direction between the first and third gate electrodes.

8. The semiconductor device of claim 7, further comprising a second dummy gate electrode extending lengthwise in the first direction between the third and second gate electrodes.

9. A semiconductor device comprising:
a substrate;
first, second and third bottom contacts in the substrate;
first, second and third active fins on respective ones of the first, second and third bottom contacts, the second and third active fins overlapping in a first direction;
first and second gate electrodes extending lengthwise in the first direction, the first gate electrode disposed on side surfaces of the first active fin, the second gate electrode disposed on side surfaces of the second and third active fins;
first dummy gate electrode extending lengthwise in the first direction between the first and second gate electrodes; and
a first top contact on the first and second active fins.

10. The semiconductor device of claim 9, further comprising
a fourth bottom contact in the substrate,
a fourth active fin on the fourth bottom contact, and
a third gate electrode extending lengthwise in the first direction, the third gate electrode disposed on side surfaces of the fourth active fin.

11. The semiconductor device of claim 10, further comprising a second top contact on the third and fourth active fins.

12. The semiconductor device of claim 10,
wherein the first and second bottom contacts overlap in a second direction and are spaced apart from each other in the second direction,
wherein the third and fourth bottom contacts overlap in the second direction and are spaced apart from each other in the second direction,
wherein the first and second bottom contacts are spaced apart from the third and fourth bottom contacts in the first direction,
wherein the second and third bottom contacts overlap in the first direction, and
wherein the first and fourth bottom contacts do not overlap in the first direction.

13. The semiconductor device of claim 10, further comprising a second dummy gate electrode extending lengthwise in the first direction between the second and third gate electrodes.

14. The semiconductor device of claim 9, further comprising first and second top source/drain regions between the first top contact and the first and second active fins.

15. The semiconductor device of claim 9, further comprising first, second and third bottom source/drain regions between the first, second and third bottom contacts and the first, second and third active fins, respectively.

16. A semiconductor device comprising:
a substrate;
first, second, third and fourth bottom contacts in the substrate;
first, second, third and fourth active fins on respective ones of the first, second, third and fourth bottom contacts, the second and third active fins overlapping in a first direction;
first, second and third gate electrodes extending lengthwise in the first direction, the first and second gate electrodes disposed on side surfaces of respective ones of the first and fourth active fins and the third gate electrode disposed on side surfaces of the second and third active fins;
a first dummy gate electrode extending lengthwise in the first direction between the first and third gate electrodes;
a first top contact on the first and second active fins;
first and second top source/drain regions between the first top contact and the first and second active fins; and
first, second, third and fourth bottom source/drain regions between the first, second, third and fourth bottom contacts and the first, second, third and fourth active fins, respectively.

17. The semiconductor device of claim 16, further comprising a second dummy gate electrode extending lengthwise in the first direction between the third and second gate electrodes.

18. The semiconductor device of claim 16,
wherein the first and second bottom contacts overlap in a second direction and are spaced apart from each other in the second direction,
wherein the third and fourth bottom contacts overlap in the second direction and are spaced apart from each other in the second direction,
wherein the first and second bottom contacts are spaced apart from the third and fourth bottom contacts in the first direction,
wherein the second and third bottom contacts overlap in the first direction, and
wherein the first and fourth bottom contacts do not overlap in the first direction.

19. The semiconductor device of claim 16,
wherein the first and second top source/drain regions are connected by the first top contact.

20. The semiconductor device of claim 16, further comprising
a second top contact on the third and fourth active fins, and third and fourth top source/drain regions between the second top contact and the third and fourth active fins.

* * * * *